(12) United States Patent
Gwak

(10) Patent No.: US 9,257,297 B2
(45) Date of Patent: Feb. 9, 2016

(54) METHOD OF FORMING A FINE PATTERN OF A SEMICONDUCTOR DEVICE

(71) Applicant: SAMSUNG ELECTRONICS CO., LTD., Suwon-si, Gyeonggi-do (KR)

(72) Inventor: Byoung-Yong Gwak, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 165 days.

(21) Appl. No.: 14/082,280

(22) Filed: Nov. 18, 2013

(65) Prior Publication Data

US 2014/0162427 A1    Jun. 12, 2014

(30) Foreign Application Priority Data

Dec. 6, 2012 (KR) .................. 10-2012-0140999

(51) Int. Cl.
| | |
|---|---|
| *H01L 21/461* | (2006.01) |
| *H01L 21/308* | (2006.01) |
| *H01L 21/033* | (2006.01) |
| *H01L 21/311* | (2006.01) |
| *H01L 45/00* | (2006.01) |
| *H01L 27/22* | (2006.01) |
| *H01L 27/24* | (2006.01) |
| *H01L 27/108* | (2006.01) |
| *H01L 27/115* | (2006.01) |

(52) U.S. Cl.
CPC .......... *H01L 21/308* (2013.01); *H01L 21/0337* (2013.01); *H01L 21/31144* (2013.01); *H01L 27/228* (2013.01); *H01L 27/2436* (2013.01); *H01L 27/2472* (2013.01); *H01L 45/04* (2013.01); *H01L 45/06* (2013.01); *H01L 45/10* (2013.01); *H01L 45/1233* (2013.01); *H01L 45/146* (2013.01); *H01L 45/147* (2013.01); *H01L 27/10852* (2013.01); *H01L 27/11556* (2013.01); *H01L 27/11582* (2013.01)

(58) Field of Classification Search
CPC .......................... H01L 21/308; H01L 21/0337
USPC .......................................................... 438/704
See application file for complete search history.

(56) References Cited

U.S. PATENT DOCUMENTS

| | | | |
|---|---|---|---|
| 8,084,310 B2 | 12/2011 | Mebarki et al. | |
| 8,178,286 B2 | 5/2012 | Chan | |
| 8,278,223 B2 | 10/2012 | Kang | |
| 8,293,456 B2 | 10/2012 | Fukuhara et al. | |
| 8,309,463 B2 | 11/2012 | Lee | |
| 2011/0294297 A1 | 12/2011 | Sukekawa | |
| 2012/0138571 A1 | 6/2012 | Black et al. | |
| 2012/0280255 A1* | 11/2012 | Masuda et al. ................. 257/77 |

FOREIGN PATENT DOCUMENTS

| | | |
|---|---|---|
| KR | 10-2003-0092569 A | 12/2003 |
| KR | 10-2010-0102422 A | 9/2010 |
| KR | 10-2010-0134418 A | 12/2010 |

(Continued)

*Primary Examiner* — Bradley K Smith
(74) *Attorney, Agent, or Firm* — Lee & Morse, P.C.

(57) ABSTRACT

A method of forming a fine pattern includes forming first line mask patterns on a mask layer to extend along a direction, forming second line mask patterns to extend along a diagonal direction with respect to the first line mask patterns, anisotropically etching the mask layer exposed by the first and second line mask patterns to form elliptical openings, and isotropically etching the mask layer provided with the openings to form a mask pattern with enlarged openings.

18 Claims, 24 Drawing Sheets

(56) References Cited

FOREIGN PATENT DOCUMENTS

| KR | 10-2011-0101404 A | 9/2011 |
| KR | 10-2011-0114046 A | 10/2011 |
| WO | WO 2009/100053 A2 | 8/2009 |

* cited by examiner

METHOD OF FORMING A FINE PATTERN OF A SEMICONDUCTOR DEVICE

CROSS-REFERENCE TO RELATED APPLICATION

Korean Patent Application No. 10-2012-0140999, filed on Dec. 6, 2012, in the Korean Intellectual Property Office, and entitled: "Methods of Forming A Fine Pattern of A Semiconductor Device," is incorporated by reference herein in its entirety.

BACKGROUND

1. Field

Example embodiments relate to a method of forming a fine pattern of a semiconductor device, and in particular, to a method of forming fine patterns arranged in a zigzag manner.

2. Description of the Related Art

A scale-down process is desirable to realize a high-density semiconductor device. For example, in order to integrate more and more devices in a limited area, patterns should be formed to have a small width and a small space.

SUMMARY

Embodiments are directed to a method of forming a fine pattern including forming first line mask patterns on a mask layer to extend along a direction, forming second line mask patterns to extend along a diagonal direction with respect to the first line mask patterns, anisotropically etching the mask layer exposed by the first and second line mask patterns to form elliptical openings, and isotropically etching the mask layer provided with the openings to form a mask pattern with enlarged openings.

The forming of the enlarged openings may reduce an ellipticity of the openings.

The ellipticity of the openings may be dependent on an etch amount of the mask layer in the isotropic etching.

The enlarged openings may have an ellipticity ranging from 0.0 to 0.2.

The mask layer may include first, second, and third mask layers that are sequentially stacked and that have an etch selectivity with respect to each other.

Forming the elliptical openings may include anisotropically etching the third mask layer to form first openings exposing a top surface of the second mask layer.

Forming the enlarged openings may include sequentially performing an anisotropic etching process and an isotropic etching process to the second mask layer exposed by the first openings to form second openings, and sequentially performing an anisotropic etching process and an isotropic etching process to the first mask layer exposed by the second openings to form third openings exposing an underlying layer.

The second openings may have an ellipticity that is less than that of the first openings. The third openings may have an ellipticity that is less than that of the second openings.

Each of forming the first line mask patterns and forming the second line mask patterns may include forming photoresist patterns on the mask layer that are repeatedly arranged with a first pitch, depositing a spacer layer on the mask layer to cover the photoresist patterns conformally, and anisotropically etching the spacer layer.

The second line mask patterns may be formed at an angle of about 15-75 degrees or at an angle of about 115-165 degrees relative to the first line mask patterns.

The first and second line mask patterns may be formed to have mirror symmetry with respect to each other.

Embodiments are also directed to a method of forming a fine pattern including forming a mask layer on an underlying layer to include a plurality of stacked layers, forming first line mask patterns extending along a direction on the mask layer, forming second line mask patterns extending along a diagonal direction with respect to the first line mask patterns to define diamond-shaped etching regions on the mask layer, and alternatingly performing an anisotropic etching process and an isotropic etching process to the layers through the diamond-shaped etching regions to form a mask pattern with enlarged openings that expose the underlying layer.

The anisotropic and isotropic etching processes may reduce an ellipticity of the etching region.

Forming the enlarged openings may include changing a shape of the openings from an ellipse to a circle.

The method may further include anisotropically etching the underlying layer using the mask pattern as an etch mask to form lower holes that are arranged in a zigzag manner and have a substantially uniform diameter.

Embodiments are also directed to a method of forming a semiconductor device having a fine pattern including providing a mask layer on an underlying layer, forming first line mask patterns on the mask layer, the first line mask patterns being spaced apart from each other and the first line mask patterns extending along a first direction, forming second line mask patterns, the second line mask patterns being spaced apart from each other and the second line mask patterns extending along a second direction with respect to the first line mask patterns, the second direction being at an angle of about 15-75 degrees to the first direction, such that diamond-shaped etching regions are defined on the mask layer by adjacent ones of the first line mask patterns and adjacent ones of the second line mask patterns, anisotropically etching the mask layer at the diamond-shaped etching regions to form elliptical openings, isotropically etching the mask layer provided with the openings to form a mask pattern with enlarged openings to expose the underlying layer, the enlarged openings being arranged in a zigzag manner and having a substantially uniform diameter, and anisotropically etching the underlying layer using the mask pattern as an etch mask to form lower holes.

The underlying layer may be a mold layer, and the method may further include forming capacitors in the lower holes.

The underlying layer may be a stacked structure of cell strings, and the method may further include forming semiconductor pillars in the lower holes.

The method may further include forming semiconductor patterns of a variable resistance memory device in the lower holes.

BRIEF DESCRIPTION OF THE DRAWINGS

Features will become apparent to those of skill in the art by describing in detail exemplary embodiments with reference to the attached drawings in which:

FIGS. 1A through 6A illustrate plan views depicting stages of a method of forming a fine pattern, according to example embodiments.

FIGS. 1B through 6B illustrate sectional views depicting stages of a method of forming a fine pattern, according to example embodiments.

DETAILED DESCRIPTION

Figure 1A:
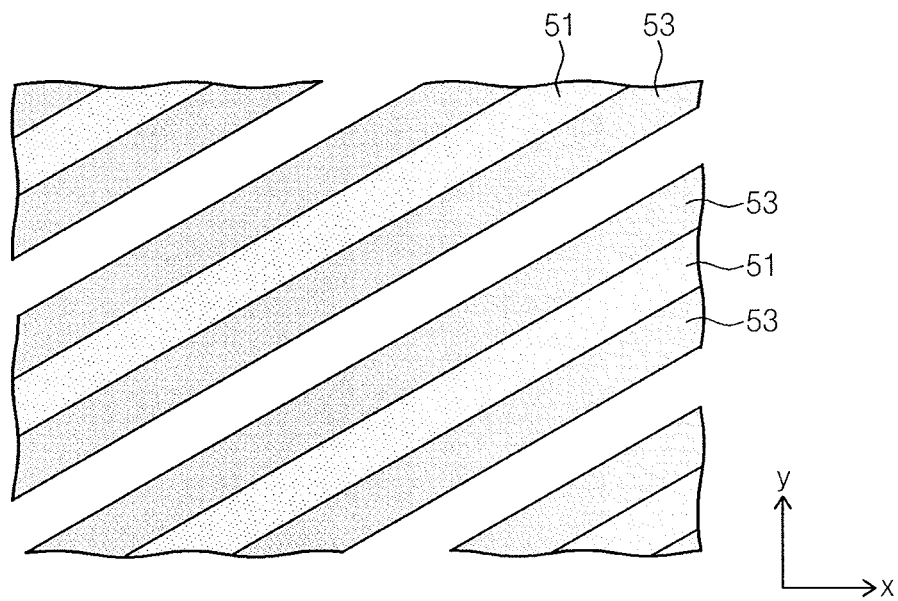

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It is to be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It is to be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It is to understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, methods of forming a fine pattern, according to example embodiments, will be described in more detail with reference to the accompanying drawings. Fine patterns in a semiconductor device may be arranged in various manners. In the case where the fine patterns are provided to have a square-shaped arrangement, there may be a difficulty in increasing a width or diameter of the fine patterns in a given area. When the fine patterns are provided to have a zigzag- or honeycomb-shaped arrangement, a space between the fine patterns may be increased, compared with the case of the square-shaped arrangement. Accordingly, the fine patterns provided in the honeycomb-shaped arrangement may have an increased diameter compared to fine patterns in the square-shaped arrangement.

Figure 7:
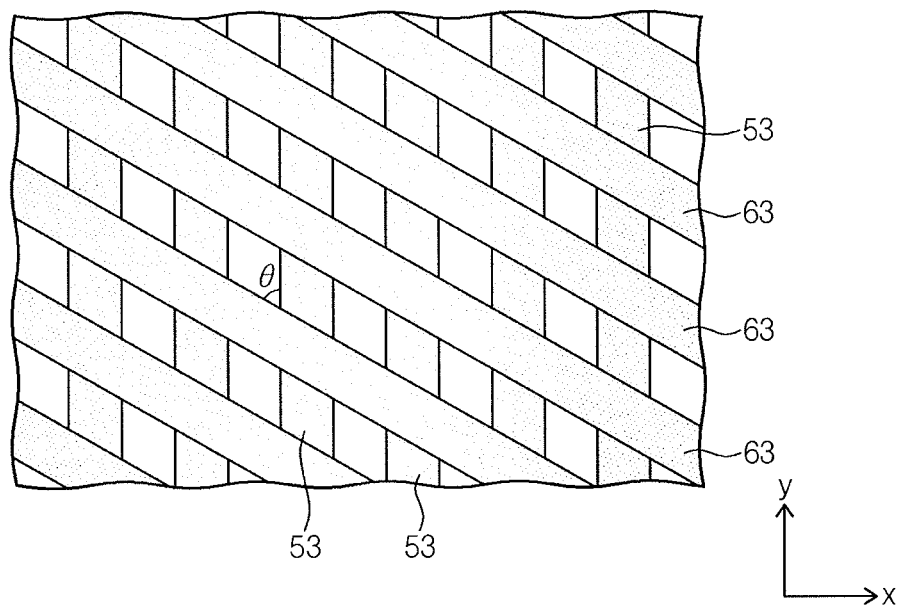
FIGS. 7 and 8 illustrate plan views depicting line mask patterns, according to modifications of example embodiments.
Figure 8:
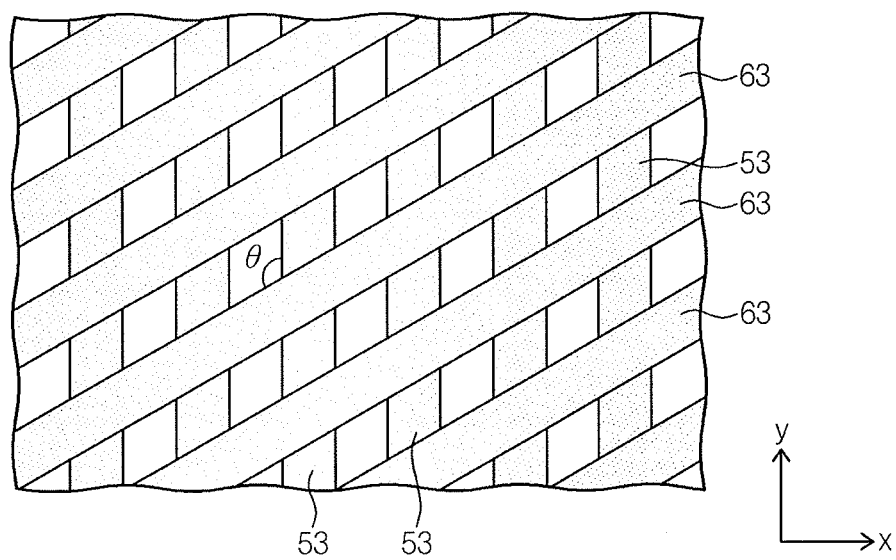
Figure 9:
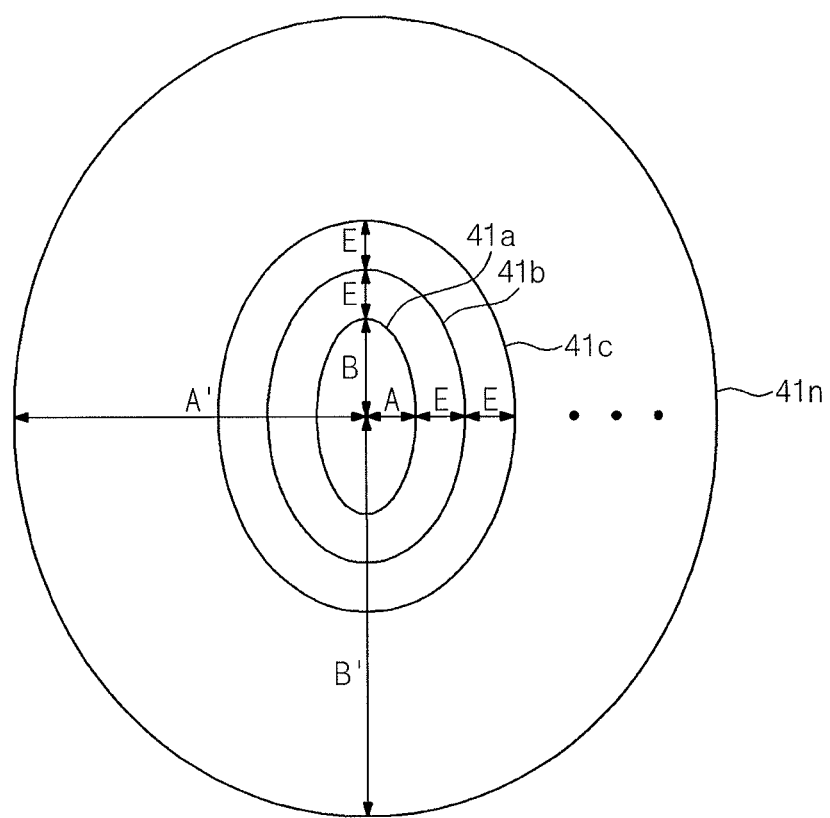
FIG. 9 illustrates a diagram to describe a forming principle of a fine pattern, according to example embodiments.

FIGS. 1A through 6A illustrate plan views depicting stages of a method of forming a fine pattern, according to example embodiments. FIGS. 1B through 6B illustrate sectional views taken along a y-axis of FIGS. 1A through 6A to depict the stages of the method of forming a fine pattern, according to example embodiments. FIGS. 7 and 8 illustrate plan views depicting line mask patterns, according to modifications of example embodiments. FIG. 9 illustrates a diagram to describe a forming principle of a fine pattern, according to example embodiments.

Figure 1B:
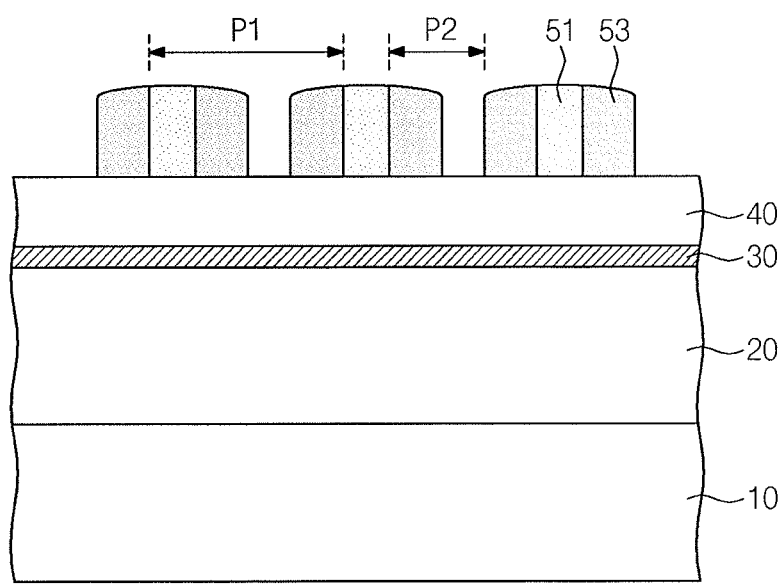

Referring to FIGS. 1A and 1B, an underlying layer 20, an etch stop layer 30, and a hard mask layer 40 may be sequentially stacked on a substrate 10.

In example embodiments, the underlying layer 20 may be formed of at least one of a semiconductor material, a conductive material, or an insulating material. For example, the underlying layer 20 may be formed of a semiconductor material including a semiconductor wafer or an epitaxial layer or a conductive material including at least one of doped polysilicon, metal silicide, metal, or metal nitride. In other example embodiments, the underlying layer 20 may be formed of an insulating material including at least one of silicon oxide, silicon nitride, silicon oxynitride, or low-k dielectric materials. In certain embodiments, the underlying layer 20 may be formed of crystalline silicon, amorphous silicon, doped silicon, silicon germanium, or a carbon-based material. The underlying layer 20 may be formed to have a single-layered or multi-layered structure. For example, the underlying layer 20 may include a plurality of insulating layers and/or at least one conductive or semiconductor layer interposed between the insulating layers. In addition, the underlying layer 20 may include at least one of a semiconductor pattern, a conductive pattern, and an insulating pattern.

The etch stop layer 30 may be formed of a material having an etch selectivity with respect to the underlying layer 20 and the hard mask layer 40. For example, the etch stop layer 30 may be formed of one selected from the group of $SiO_2$, SiON, $Si_3N_4$, SiCN, and SiC.

The hard mask layer 40 may be formed of a material that has an etch selectivity with respect to the underlying layer 20 when etching the underlying layer 20. For example, the hard mask layer 40 may include at least one of silicon-containing materials, such as polysilicon, SiON, $Si_3N_4$, and SiCN. In other implementations, the hard mask layer 40 may be formed of a spin-on-hardmask (SOH) layer or an amorphous carbon layer (ACL). The SOH layer may include a carbon-based SOH layer or a silicon-based SOH layer. In some implementations, the hard mask layer 40 may be formed of polysilicon.

Next, as shown in FIGS. 1A and 1B, first photoresist patterns 51 may be formed on the hard mask layer 40.

The first photoresist patterns 51 may be line-and-space patterns. The first photoresist patterns 51 may extend along a first direction, for example, crossing both of x and y axes depicted in the drawings. The first photoresist patterns 51 may be repeatedly arranged, with a first pitch P1, on the hard mask layer 40. In some embodiments, the first pitch P1 may be greater than two times of a line width of the first photoresist pattern 51. In example embodiments, a dimension or width of fine patterns to be formed may be controlled by adjusting the first pitch P1 of the first photoresist patterns 51.

The formation of the first photoresist patterns 51 may include forming a photoresist layer on the hard mask layer 40, and then, performing exposure and development processes to form the line-and-space patterns. An anti-reflection pattern (not shown) may be formed between the hard mask layer 40 and the first photoresist patterns 51. The anti-reflection pattern may be formed of a material having an etch selectivity with respect to the hard mask layer 40. In addition, the material for the anti-reflection pattern may be selected to be able to absorb light in the exposure process and prevent light from being reflected. In example embodiments, the anti-reflection pattern may be formed of an organic compound or an inorganic compound. For example, the anti-reflection pattern may be formed of a photoresist material or an organic material having an etching property similar to the photoresist material.

After the formation of the first photoresist patterns 51, first line mask patterns 53 may be formed on both sidewalls of each of the first photoresist patterns 51.

The formation of the first line mask patterns 53 may include forming a first mask layer on the hard mask layer 40 provided with the first photoresist patterns 51 to cover conformally top and side surfaces of the first photoresist patterns 51, and then, anisotropically etching the first mask layer to expose the hard mask layer 40. The first mask layer may have a thickness that is substantially equivalent to the line width of the first photoresist patterns 51. Accordingly, the first line mask patterns 53 may be repeatedly arranged, with a second pitch P2, on the hard mask layer 40, and the second pitch P2 may be about half the first pitch P1. In example embodiments, the second pitch P2 may be equivalent to two times the line width of each of the first photoresist patterns 51. A line width of, and a space between, the first line mask patterns 53 may be changed. In addition, the first line mask patterns 53 may extend along the first direction or parallel to the first photoresist patterns 51. The first line mask patterns 53 may extend to cross both of x- and y-axes.

The first line mask patterns 53 may be formed of a material that has an etch selectivity with respect to the hard mask layer 40 when anisotropically etching the hard mask layer 40. In example embodiments, the first line mask patterns 53 may include at least one of silicon-containing materials, such as polysilicon, SiON, $Si_3N_4$, and SiCN. In other embodiments, the hard mask layer 40 may be formed as a spin-on-hardmask (SOH) layer or an amorphous carbon layer (ACL).

After the formation of the first line mask patterns 53, the first photoresist patterns 51 may be removed using ashing and strip processes. Accordingly, the top surface of the hard mask layer 40 may be exposed between the first line mask patterns 53.

Figure 2A:
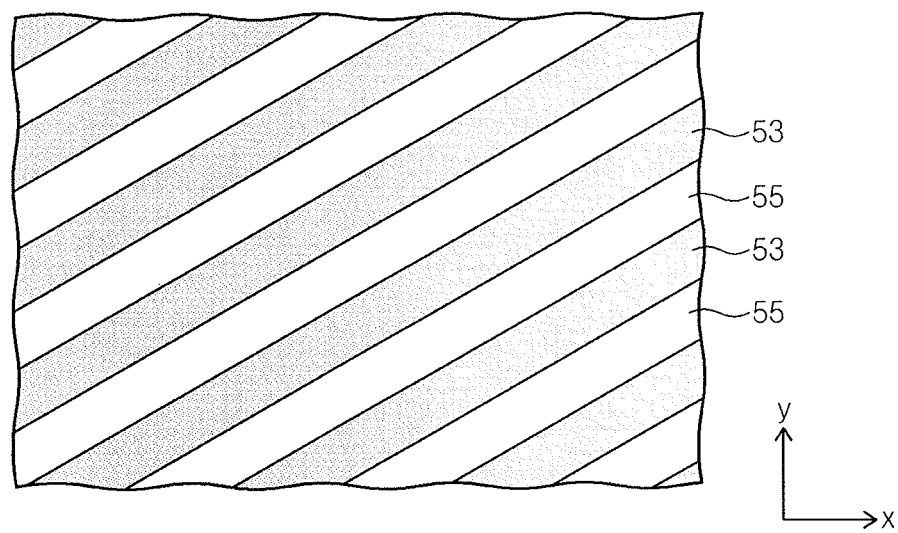
Figure 2B:
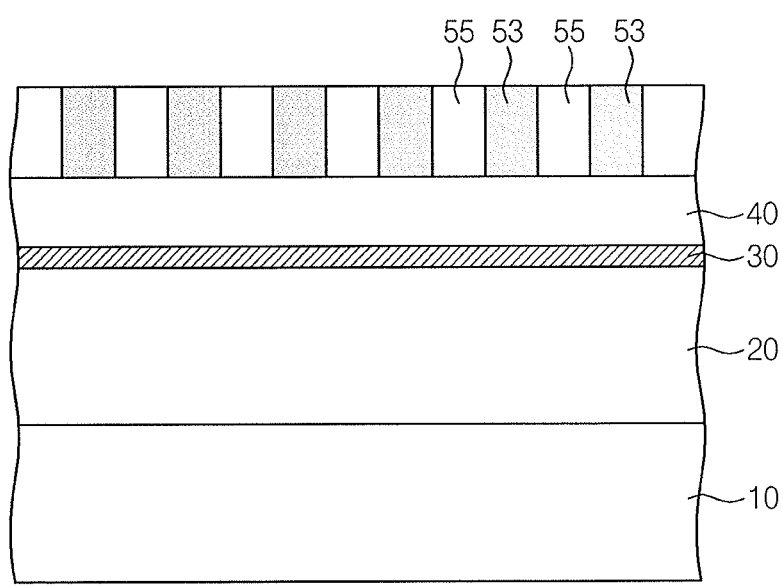

Referring to FIGS. 2A and 2B, gapfill patterns 55 may be formed to fill gap regions between the first line mask patterns 53.

The formation of the gapfill patterns 55 may include forming a gap-filling layer on the hard mask layer 40 provided with the first line mask patterns 53, and then, planarizing the gap-filling layer to expose top surfaces of the first line mask patterns 53. The gapfill patterns 55 may be formed of a material having an etch selectivity with respect to the first line mask patterns 53. For example, the gapfill patterns 55 may include a polysilicon layer, a silicon nitride layer, a silicon oxynitride layer, or a carbon-containing layer.

Figure 3A:
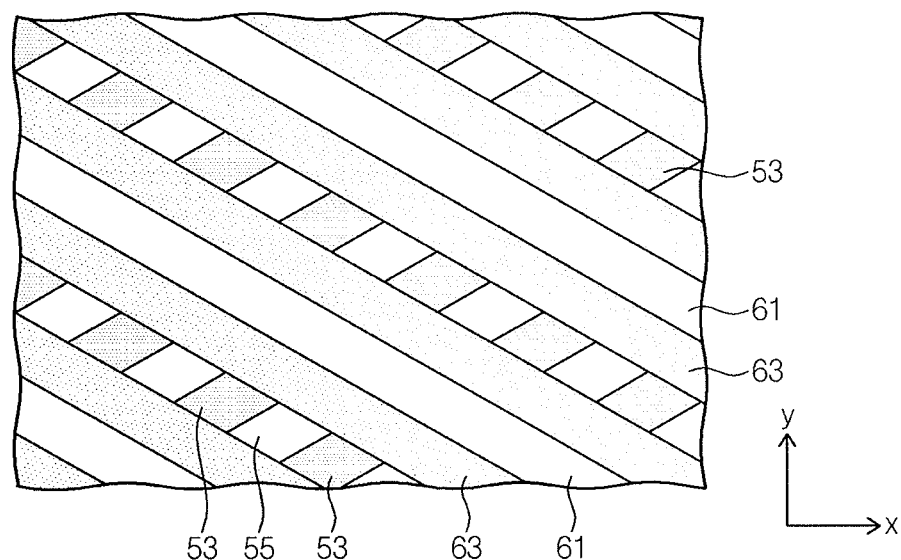
Figure 3B:
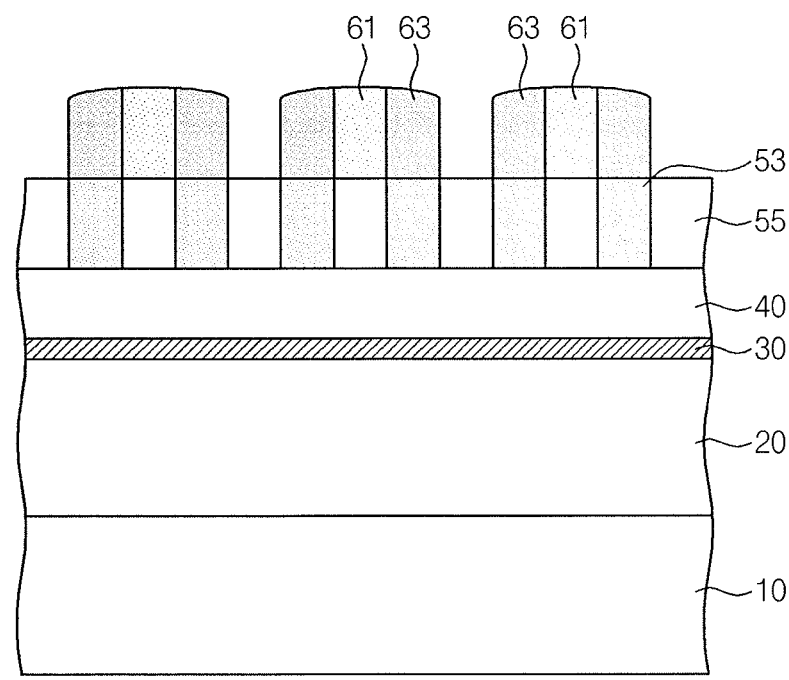

Referring to FIGS. 3A and 3B, second photoresist patterns 61 may be formed to extend along a diagonal direction with respect to the first line mask patterns 53.

In example embodiments, the second photoresist patterns 61 may be formed to have mirror symmetry with respect to the first line mask patterns 53. For example, the second photoresist patterns 61 may not be parallel to either of the x- and y-axes. In example embodiments, the second photoresist patterns 61 may be repeatedly arranged to have the same pitch as the first pitch of the first photoresist patterns 51. In other example embodiments, the second photoresist patterns 61 may have a pitch different from that of the first photoresist patterns 51.

The formation of the second photoresist patterns 61 may include forming a photoresist layer on the first line mask patterns 53 and the gapfill patterns 55, and then, performing exposure and development processes to form line-and-space patterns.

Thereafter, in a manner similar to the formation of the first line mask patterns 53, second line mask patterns 63 may be formed on both sidewalls of the second photoresist patterns 61. Accordingly, the second line mask patterns 63 may extend along a diagonal direction with respect to the first line mask patterns 53. For example, the second line mask patterns 63 may be formed at an angle of about 0-90 degrees or about 90-180 degrees relative to the first line mask patterns 53. In the present embodiment, the first line mask patterns 53 and the second line mask pattern 63 may be arranged to have mirror symmetry with respect to each other.

In example embodiments, the second line mask patterns 63 may have a line width that is substantially equivalent to that of the second photoresist patterns 61. For example, the second line mask patterns 63 may be repeatedly arranged to have the same pitch as that of the first line mask patterns 53. In other implementations, the line width of, and space between, the second line mask patterns 63 may be changed.

The second line mask patterns 63 may be formed of a material that has an etch selectivity with respect to the hard mask layer 40 when etching the hard mask layer 40. In addition, the second line mask patterns 63 may be formed of a material having an etch selectivity with respect to the gapfill patterns 55. In example embodiments, the second line mask patterns 63 may include at least one of silicon-containing materials, such as polysilicon, SiON, $Si_3N_4$, and SiCN. In other implementations, the hard mask layer 40 may be formed as a spin-on-hardmask (SOH) layer or an amorphous carbon layer (ACL).

After the formation of the second line mask patterns 63, the second photoresist patterns 61 may be removed using ashing and strip processes. Accordingly, the first line mask patterns 53 and the gapfill patterns 55 may be partially exposed between the second line mask patterns 63.

According to embodiments shown in FIGS. 7 and 8, the first and second line mask patterns 53 and 63 may be formed to cross each other in a diagonal direction, and the first and second line mask patterns 53 and 63 may have no symmetry to each other. For example, the first line mask patterns 53 may be parallel to one of x- and y-axis, and the second line mask patterns 63 may not be parallel to either of x- and y-axes. For example, the second line mask patterns 63 may be formed at an angle, θ, of about 15-75 degree as shown in FIG. 7 or of about 115-165 degree as shown in FIG. 8, relative to the first line mask patterns 53.

Figure 4A:
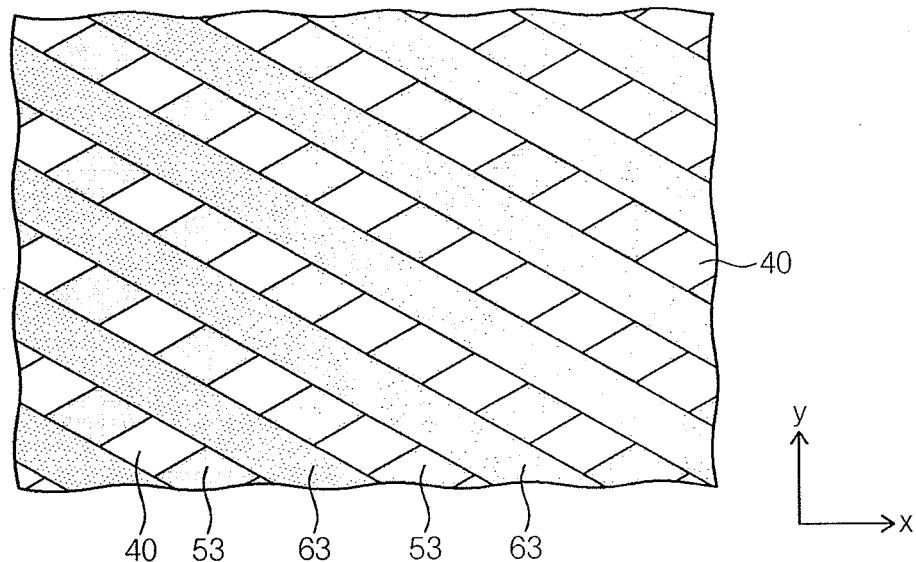
Figure 4B:
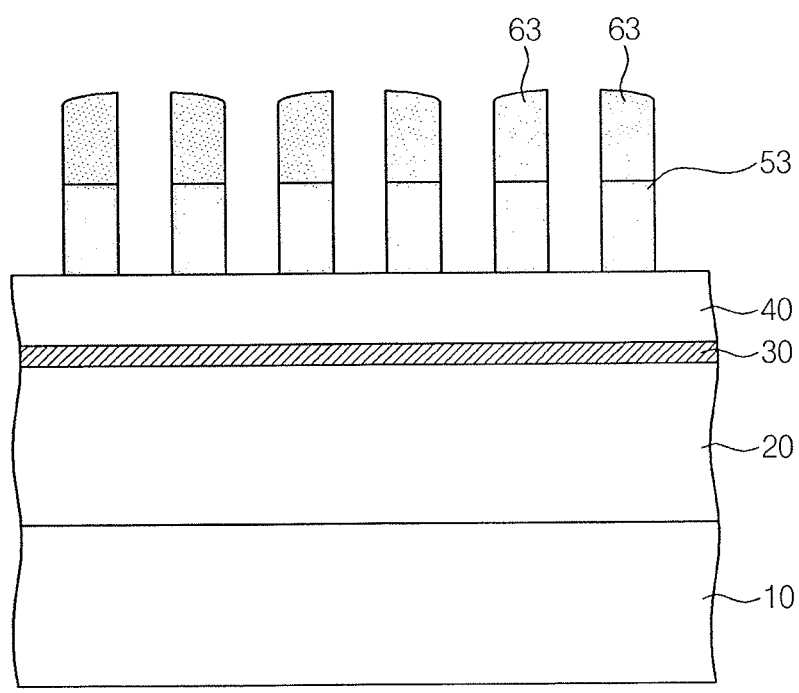

Referring to FIGS. 4A and 4B, the gapfill patterns 55 exposed by the first and second line mask patterns 53 and 63 may be anisotropically etched. The gapfill patterns 55 may be anisotropically etched using an etch recipe having an etch selectivity with respect to the first and second line mask patterns 53 and 63. The gapfill patterns 55 may be anisotropically etched such that the hard mask layer 40 is partially exposed. In certain embodiments, portions of the gapfill patterns 55 may remain between the first line mask patterns 53 below the second line mask patterns 63.

In example embodiments, the first and second line mask patterns 53 and 63 may have the diagonally elongated shapes. Accordingly, portions of the hard mask layer 40 exposed by the first and second line mask patterns 53 and 63 may have a diamond shape.

Figure 5A:
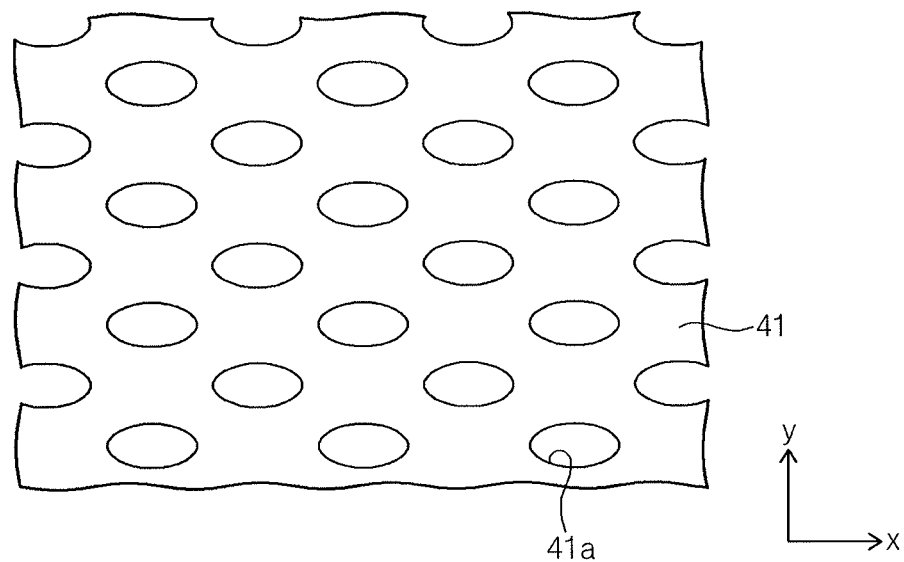
Figure 5B:
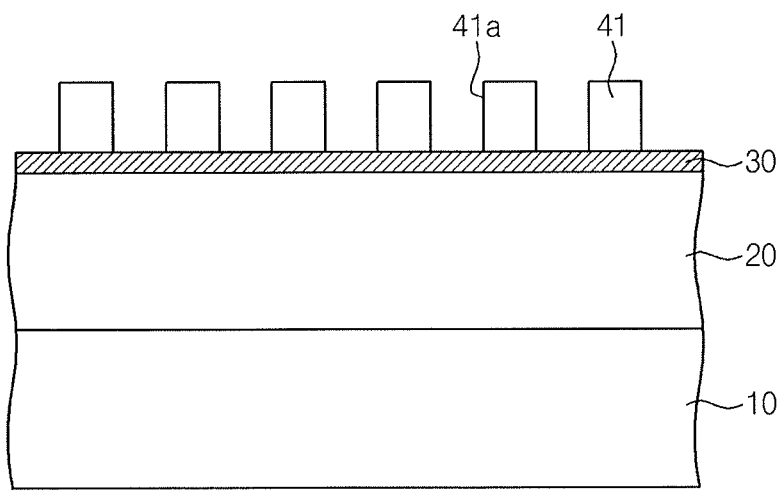

Referring to FIGS. 5A and 5B, the hard mask layer 40 may be anisotropically etched using the first and second line mask patterns 53 and 63. Accordingly, openings 41*a*, which may be arranged to have a zigzag arrangement, may be formed in the hard mask pattern 41.

The first and second line mask patterns 53 and 63 are used for an etch mask defining an diamond-shaped etch region. Accordingly, the openings 41*a* of the hard mask pattern 41 may have an elliptical shape with a minor axis and a major axis.

Figure 6A:
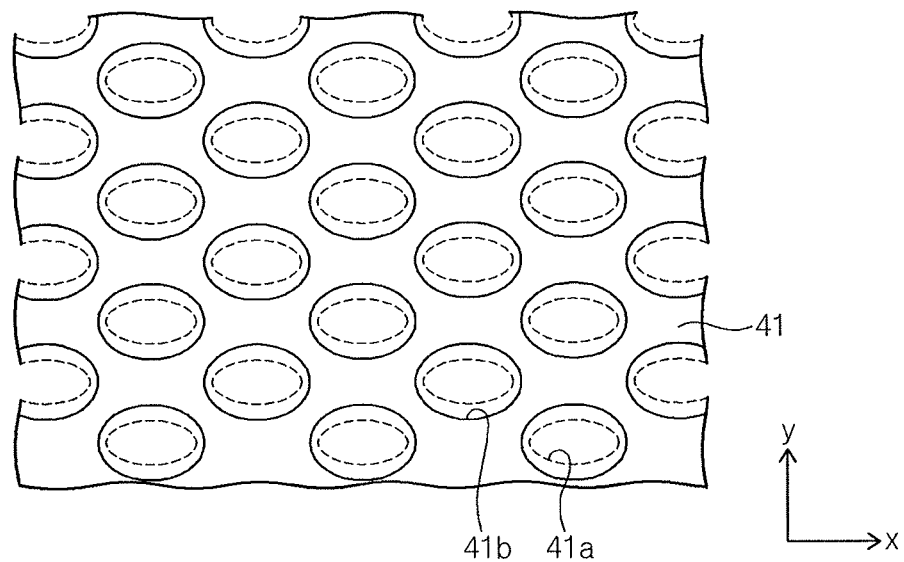
Figure 6B:
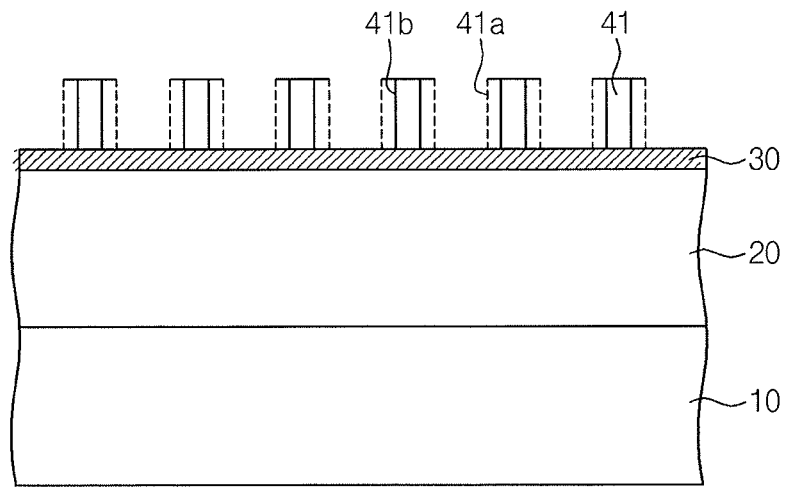

Referring to FIGS. 6A and 6B, the hard mask pattern 41 with the elliptical openings 41*a* may be isotropically etched to form enlarged openings 41*b*.

In example embodiments, a wet etching process may be performed to etch the hard mask pattern 41 in an isotropic etching manner. The inner sidewalls of the opening 41*a* may be etched during the wet etching process. For example, in the case where the hard mask pattern 41 includes a silicon oxide layer, the wet etching process may be performed using a standard cleaning 1 (SC1) solution containing $NH_4OH/H_{-2}$—$O_2/H_2O$, a diluted HF solution, and a buffer oxide etchant (BOE). In other implementations, in the case where the hard mask pattern 41 includes a silicon nitride layer, the wet etching process may be performed using an etching solution containing a phosphoric acid.

In example embodiments, the first and second line mask patterns 53 and 63 of FIG. 4A may remain on the hard mask pattern 41, after the wet etching process. This may make it possible to prevent a thickness of the hard mask pattern 41 from being reduced by the wet etching process. Accordingly, after the isotropic etching process, the enlarged openings 41*b* may be formed to expose partially bottom surfaces of the first and second line mask patterns 53 and 63.

Widths of the opening 41*a* along its major and minor axes may be increased as the result of the isotropic etching process. An etch amount of the hard mask pattern 41 in the isotropic etching process may be the same in directions of the major and minor axes of the opening 41*a*. Accordingly, a length to be increased along the minor axis may be substantially the same as that to be increased along the minor axis.

The isotropic etching process may reduce an ellipticity of the openings 41*a* formed by the anisotropic etching process. For example, as shown in FIG. 9, the opening 41*a*, which may be formed using the first and second line mask patterns 53 and 63 of FIG. 4A diagonally crossing each other, may have an ellipticity given by (B−A)/B, where B and A are major and minor axis lengths of the opening 41*a*, respectively, and the ellipticity is a ratio between the major and minor axes of the opening 41*a*. In some embodiments, the opening 41*a* may have an ellipticity of about 0.3 to 0.5.

As a result of the isotropic etching process, the minor axis length and the major axis length may be increased by the same etch amount E. As the isotropic etching process continues, an etch amount E of the hard mask pattern 41 may be increased and thereby the ratio between the major and minor axes of the opening 41 may be reduced. For example, the openings 41*a* before the isotropic etching process has the ellipticity of (B−A)/B, and the enlarged openings 41*a*, 41*b*, 41*c*, . . . , to 41*n* after the isotropic etching process may have the ellipticity of (B'−A')/B'. Accordingly, as the etch amount E increases, the ellipticity of the enlarged openings 41*a*, 41*b*, 41*c*, . . . , and 14*n* may be decreased to (B−A)/(B+E+E+ . . . ). In some embodiments, the ellipticity of the enlarged opening 41*a* may be about 0.0 to 0.2. In the drawings, the openings enlarged by the isotropic etching process are depicted by reference numbers 41b, 41c, . . . , and 41n. As shown, the isotropic etching process continues, the enlarged opening 41n may become shaped like a circle.

In example embodiments, the etch amount E in the isotropic etching process may be controlled by adjusting a process time of the isotropic etching process. For example, if the isotropic etching process is continued, the ellipticity of the opening 41a may have a value close to zero. The enlarged openings 41b of the hard mask pattern 41 may be shaped like a circle.

FIGS. 10 through 13 illustrate diagram illustrating a stages of a method of forming a fine pattern, according to other example embodiments.

Figure 10:
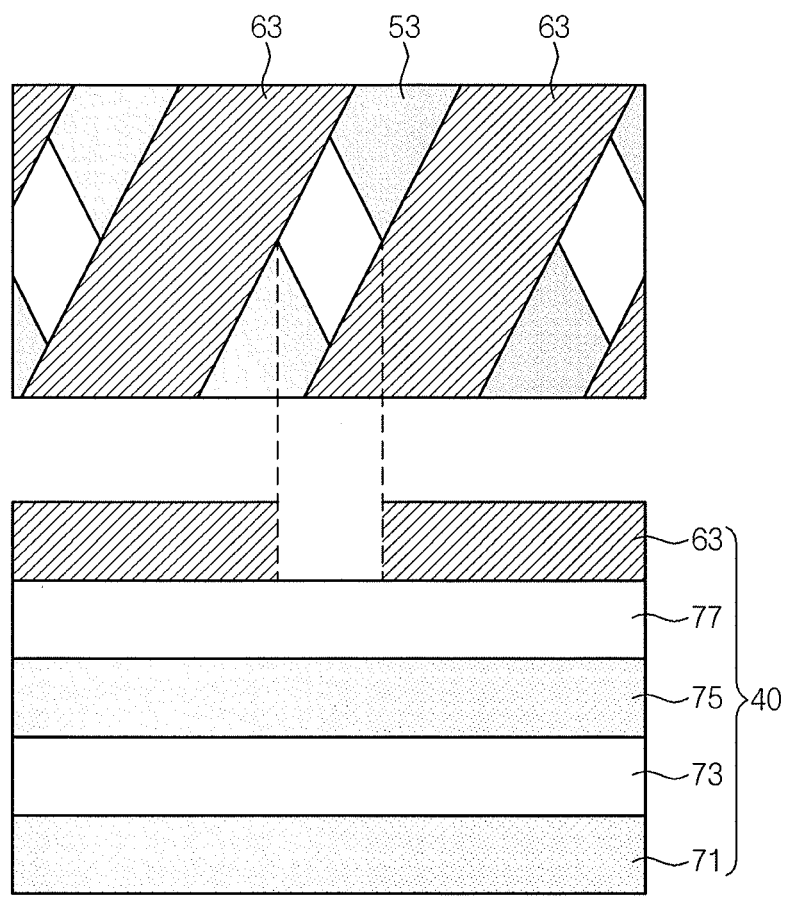
FIGS. 10 through 14 illustrate stages of a method of forming a fine pattern, according to other example embodiments.

Referring to FIG. 10, as described with reference to FIGS. 1A through 4A, the first and second line mask patterns 53 and 63 may be formed on the hard mask layer 40 to cross each other in a diagonal direction. The first and second line mask patterns 53 and 63 may be formed to expose a region shaped like a diamond.

In the present embodiment, the hard mask layer 40 may be a stack including a plurality of mask layers 71, 73, 75, and 77. At least one of the mask layers 71, 73, 75, and 77 may be formed to have an etch selectivity with respect to the others. The number of the mask layers 71, 73, 75, and 77 may be changed depending on the number of the subsequent isotropic etching processes. For example, the hard mask layer 40 may include first, second, third, and fourth mask layers 71, 73, 75, and 77. In example embodiments, the hard mask layer 40 may be formed by alternatingly and repeatedly stacking first and second layers having an etch selectivity with respect to each other. The first and second layers may be, for example, at least one selected from the group of a polysilicon layer, a silicon nitride layer, a silicon oxynitride layer, and a carbon-containing layer.

Figure 11:
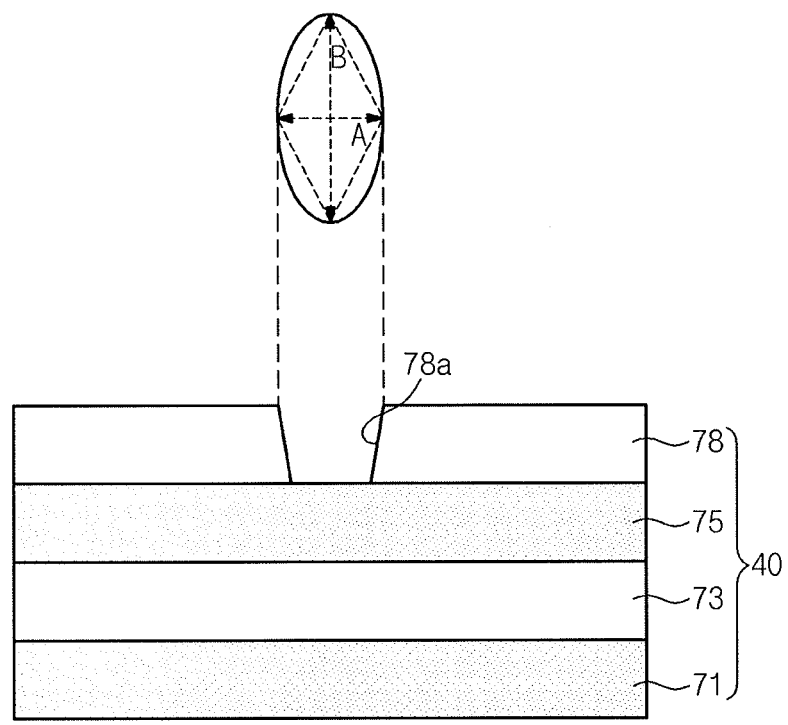

Referring to FIG. 11, the uppermost one, e.g., 77, of the mask layers may be anisotropically etched using the first and second line mask patterns 53 and 63 as an etch mask. Accordingly, a first mask pattern 78 may be formed to have a first opening 78a shaped like an ellipse. Here, the first opening 78a may be formed to have an ellipticity (i.e., a ratio between its major and minor axes) of $(B-A)/B$.

Figure 12:
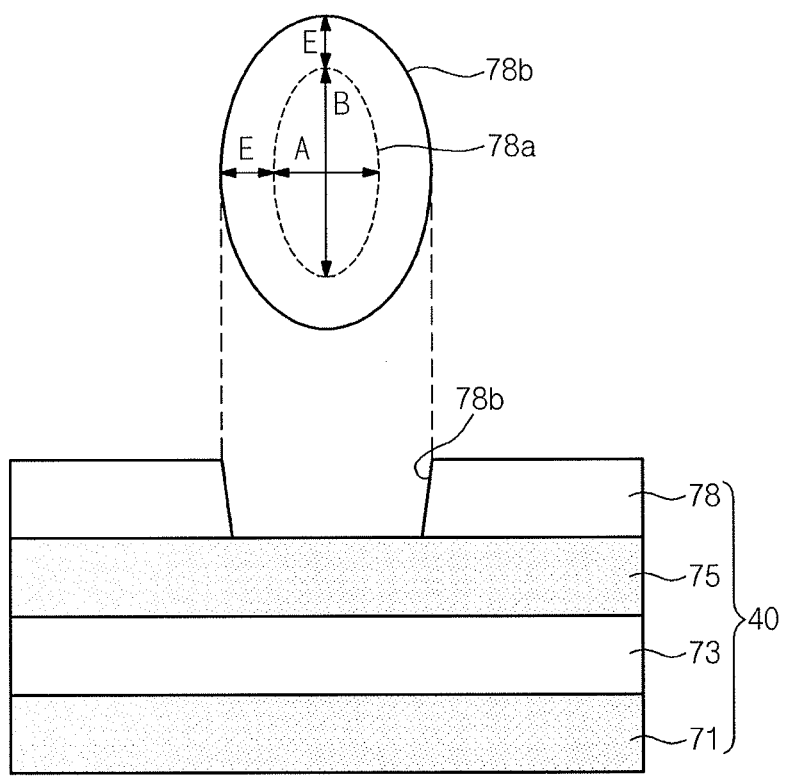

Referring to FIG. 12, the first mask pattern 78 may be isotropically etched to form an enlarged first opening 78b in the first mask pattern 78.

The isotropic etching process of the first mask pattern 78 may be performed using the second mask layer 75 as an etch stop layer. A thickness of the first mask pattern 78 may be preserved by the first and second line mask patterns 53 and 63 that remain on the first mask pattern 78. As the result of the isotropic etching process, both of major and minor axis lengths of the opening 78a may be increased by an etch amount E of the first mask pattern 78. Accordingly, the enlarged first opening 78b may have an ellipticity of $(B-A)/(B+E)$, which is smaller than that before the isotropic etching process.

Figure 13:
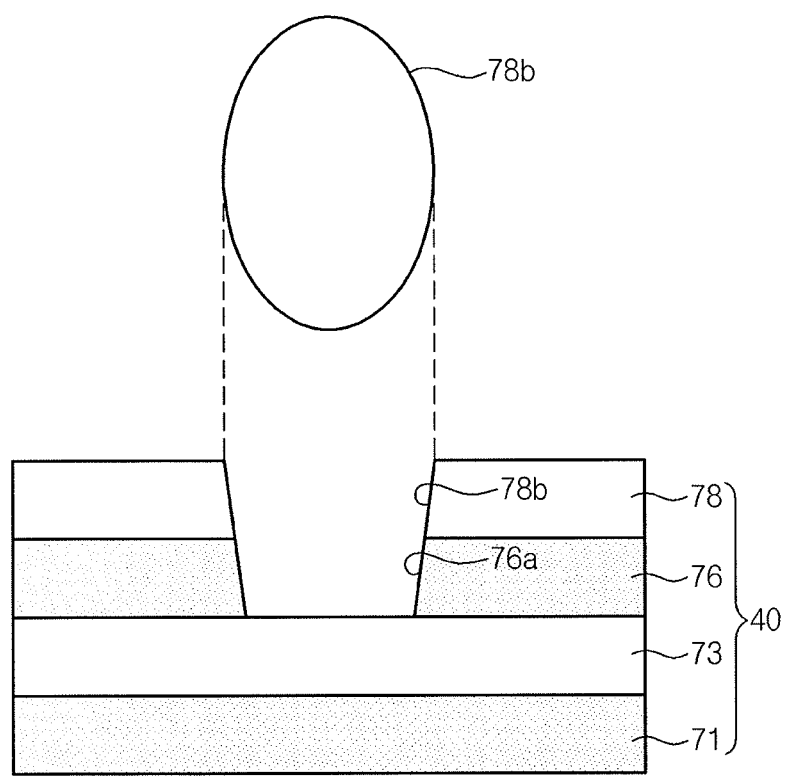

Referring to FIG. 13, the second mask layer 75 may be anisotropically etched using the first mask pattern 78 as an etch mask. Accordingly, the second mask layer 75 may be formed to have a second opening 76a, whose ellipticity is substantially equivalent to that of the enlarged first opening 78b of the first mask pattern 78. The third mask layer 73 below the second opening 76a may be used an etch stop layer in the formation of the second opening 76a.

Figure 14:
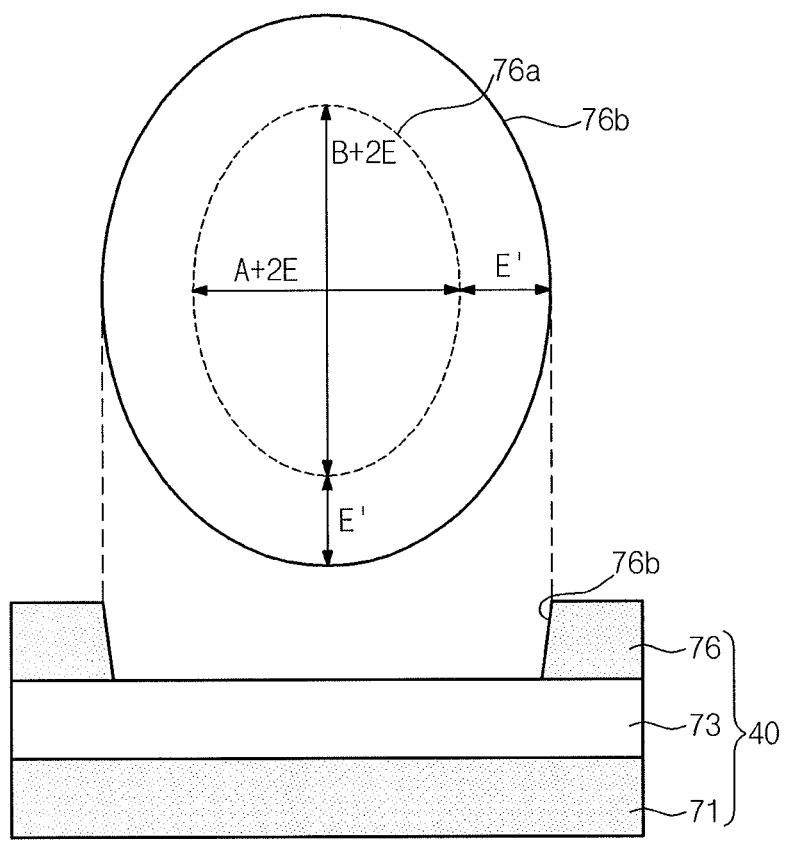

Referring to FIG. 14, the second mask pattern 76 may be isotropically etched to form an enlarged second opening 76b. The third mask layer 73 may be used as an etch stop layer in the isotropic etching process, and the first mask pattern 78 may be removed after the isotropic etching process of the second mask pattern 76.

The enlarged second opening 76b may have the ellipticity of $(B-A)/(B+2E+E')$ that is smaller than that, i.e., $(B-A)/(B+2E)$, of the enlarged first opening 76a. In the isotropic etching process of the second opening 76a, an etch amount E' of the second mask pattern 76 may be equivalent to or different from the etch amount E of the first mask pattern 78.

In the same manner, anisotropic and isotropic etching processes may be performed to etch a plurality of mask layers, and thus, the ellipticity of the opening in the hard mask layer 40 may be decreased.

A method of fabricating a semiconductor device according to example embodiments will be described below. The fine-pattern forming method, according to example embodiments, may be used for the method of fabricating a semiconductor device. Here, the semiconductor device may be one of high-density semiconductor memory devices (e.g., dynamic random access memory (DRAM), static RAM (SRAM), phase change RAM (PRAM), resistance RAM (RRAM), magnetic RAM (MRAM), ferroelectric RAM (FRAM), and FLASH memory), a micro electro mechanical systems (MEMS) device, an optoelectronic device, or a processor (e.g., CPU or DSP). In example embodiments, the semiconductor device may include semiconductor chips of the same or different kind.

Hereinafter, a semiconductor memory device, which may be fabricated by the fine-pattern forming method according to example embodiments, will be described with reference to FIGS. 15 through 21.

Figure 15:
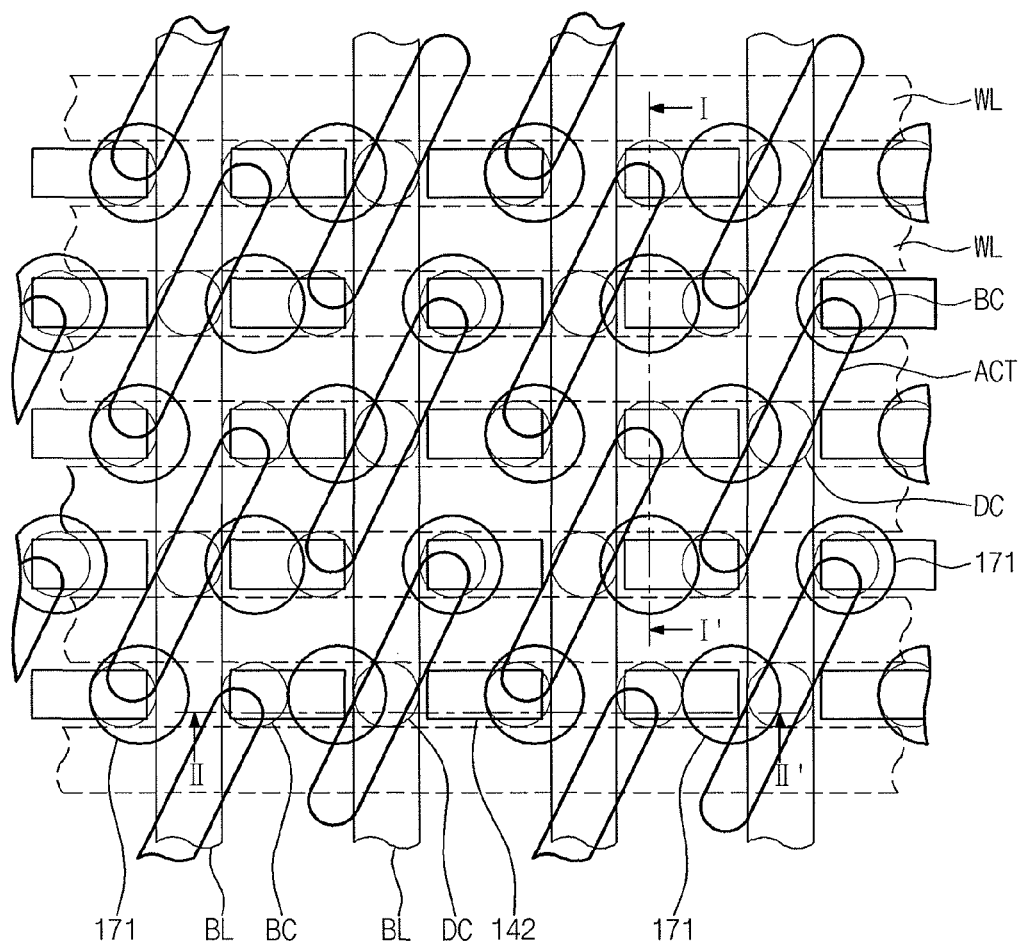
FIG. 15 illustrates a plan view depicting a semiconductor memory device that may be fabricated by the forming method of the fine pattern according to example embodiments.

FIG. 15 illustrates a plan view depicting a semiconductor memory device that may be fabricated by the forming method of a fine pattern according to example embodiments. FIGS. 16 through 21 illustrate sectional views taken along lines I-I' and II-II' of FIG. 15 to depict stages of a method of fabricating a semiconductor memory device, according to example embodiments.

Figure 16:
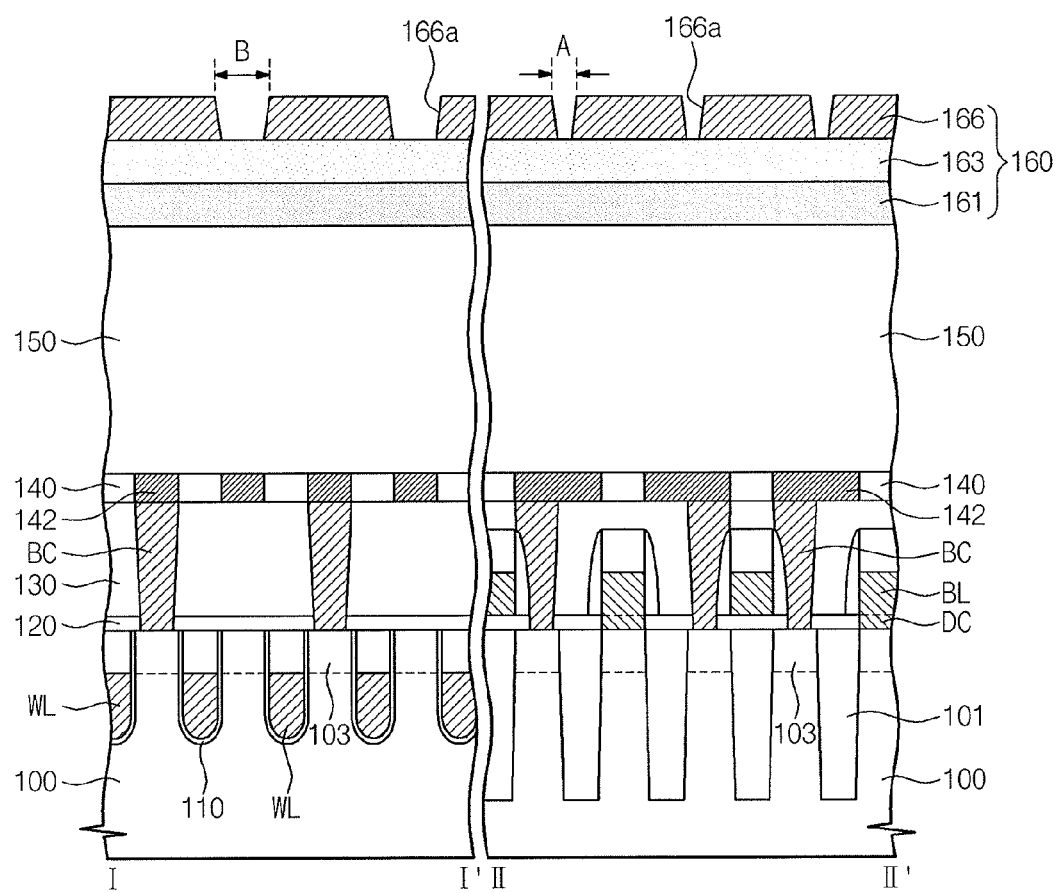
FIGS. 16 through 21 illustrate sectional views taken along lines I-I' and II-II' of FIG. 15 to depict stages of a method of fabricating a semiconductor memory device, according to example embodiments.

Referring to FIGS. 15 and 16, a semiconductor memory device may include word lines WL and bit lines BL crossing each other and memory cells provided at intersections between the word and bit lines WL and BL.

For example, a device isolation layer 101 may be formed on a semiconductor substrate 100 to define active regions ACT. The active regions ACT may be formed to have a bar shape. Further, the active regions ACT may be formed in such a way that the major axis of each active region ACT is at an angle to both the word lines WL and the bit lines BL.

The word lines WL may be provided to cross the active regions ACT. In some embodiments, a recess region may be formed in a top surface of the semiconductor substrate 100, and the word lines WL may be provided in the recess region with a gate insulating layer 110 interposed therebetween. Further, the word lines WL may have a top surface that is lower than that of the semiconductor substrate 100, and an insulating material may be formed to fill a remaining portion of the recess region provided with the word line WL.

Source and drain regions 103 may be formed in portions of the active region ACT located at both sides of each word line WL. The source and drain regions 103 may be doped regions.

The word lines WL and the source and drain regions 103 may constitute a plurality of MOS transistors that are integrated on the semiconductor substrate 100.

The bit lines BL may be provided on the semiconductor substrate 100 to cross the word lines WL. An interlayered insulating layer 120 may be interposed between the bit lines BL and the semiconductor substrate 100, and bit line contact plugs DC may be formed through the interlayered insulating layer 120 to connect the source and drain regions 103 electrically with the bit line BL.

An upper interlayered insulating layer 130 may be formed to cover the bit lines BL, and contact plugs BC may be formed through the upper interlayered insulating layer 130 to connect memory elements electrically with the source and drain regions 103. In example embodiments, the contact plugs BC may be provided on the active region ACT at both sides of the bit line BL.

The formation of the contact plugs BC may include patterning the upper interlayered insulating layer 120 to form contact holes exposing the source and drain regions 103, forming a conductive layer to fill the contact holes, and then, planarizing the conductive layer. The contact plug BC may be formed of at least one of a doped polysilicon layer, a metal layer, a metal nitride layer, or a metal silicide layer.

In some embodiments, contact pads 142 may be formed on the contact plugs BC, respectively. The contact pads 142 may be two-dimensionally arranged on the upper interlayered insulating layer 130. Due to the presence of the contact pads 142, a lower electrode of a capacitor provided thereon can be connected to the contact plugs BC therebelow with an increased contact area. For example, a pair of the contact pads 142, which are provided to be adjacent to each other at both sides of the bit line BL, may be extended toward opposite directions.

Referring to FIGS. 15 and 16, a mold layer 150 may be formed on an interlayered insulating layer 140 provided with the contact pads 142. For example, the mold layer 150 may include an etch stop layer, a lower mold layer, a supporting layer, and an upper mold layer, which are sequentially stacked on the interlayered insulating layer 140. In example embodiments, the lower and upper mold layers may be formed of silicon oxide, the etch stop layer and the supporting layer may be formed of materials that can have an etch selectivity with respect to mold layers in a subsequent step of etching the mold layers in a wet etching manner. For example, the etch stop layer and the supporting layer may be formed of silicon nitride.

Generally, when a capacitor has a cylindrical structure, a height of the lower electrode of the capacitor may vary depending on the thickness of a mold layer used in forming the capacitor, and a capacitance of the capacitor may vary depending on the height of the lower electrode. Typically, the greater the height of the lower electrode formed using the mold layer, the higher the capacitance of the capacitor. A memory capacity of a DRAM device including a capacitor may be increased by increasing the thickness of the mold layer used in forming the capacitor. Accordingly, in forming the semiconductor memory device as described herein, the thickness of the mold layer 150 (used in forming a capacitor as described below) may be suitably selected.

Next, a hard mask layer 160 may be formed on the mold layer 150. The hard mask layer 160 may include a plurality of mask layers 161, 163, and 166. The plurality of the mask layers 161, 163, and 166 may be formed to have etch selectivity with respect to each other.

The first mask layer 166 may be anisotropically etched using first and second line mask patterns diagonally crossing each other, e.g., 53 and 63 of FIG. 4A. Accordingly, first openings 166a may be formed to have a zigzag arrangement. Further, the first and second line mask patterns (53 and 63 of FIG. 4A) may be formed to expose a region shaped like a diamond. Accordingly, the first openings 166a may be formed to have an elliptical shape. For example, the first openings 166a may be formed to have an ellipticity (or an ratio between its major and minor axes) given by (B−A)/B.

Figure 17:
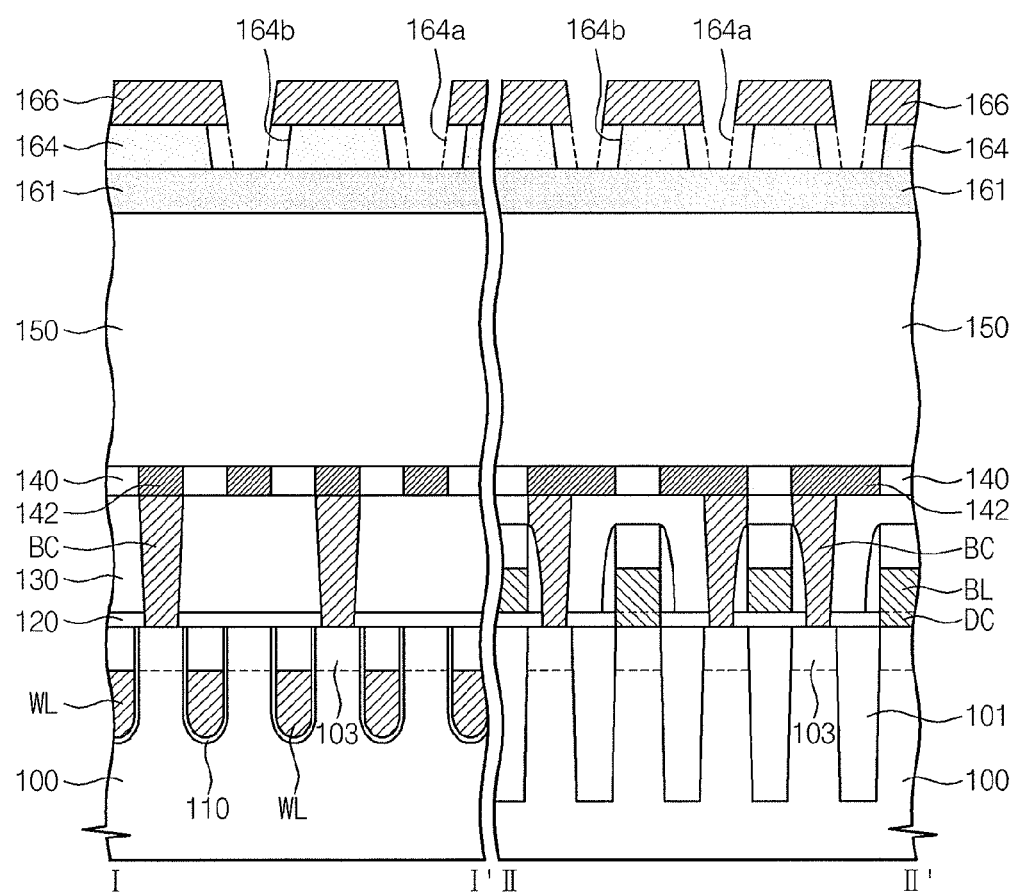

Referring to FIG. 17, an anisotropic etching process and an isotropic etching process may be sequentially performed to the second mask layer 163, thereby forming a second mask pattern 164 with enlarged second openings 164b.

The second mask layer 163 may be anisotropically etched using the first mask pattern 166 to form second openings 164a having the same ellipticity as that of the first openings 166a. In other embodiments, the anisotropic etching process of the second mask layer 163 may be performed after the isotropic etching process of the first openings 166a. Thereafter, the second openings 164a may be isotropically etched to form enlarged second openings 164a in the second mask layer 164. The second openings 164a may have a reduced ellipticity.

Figure 18:
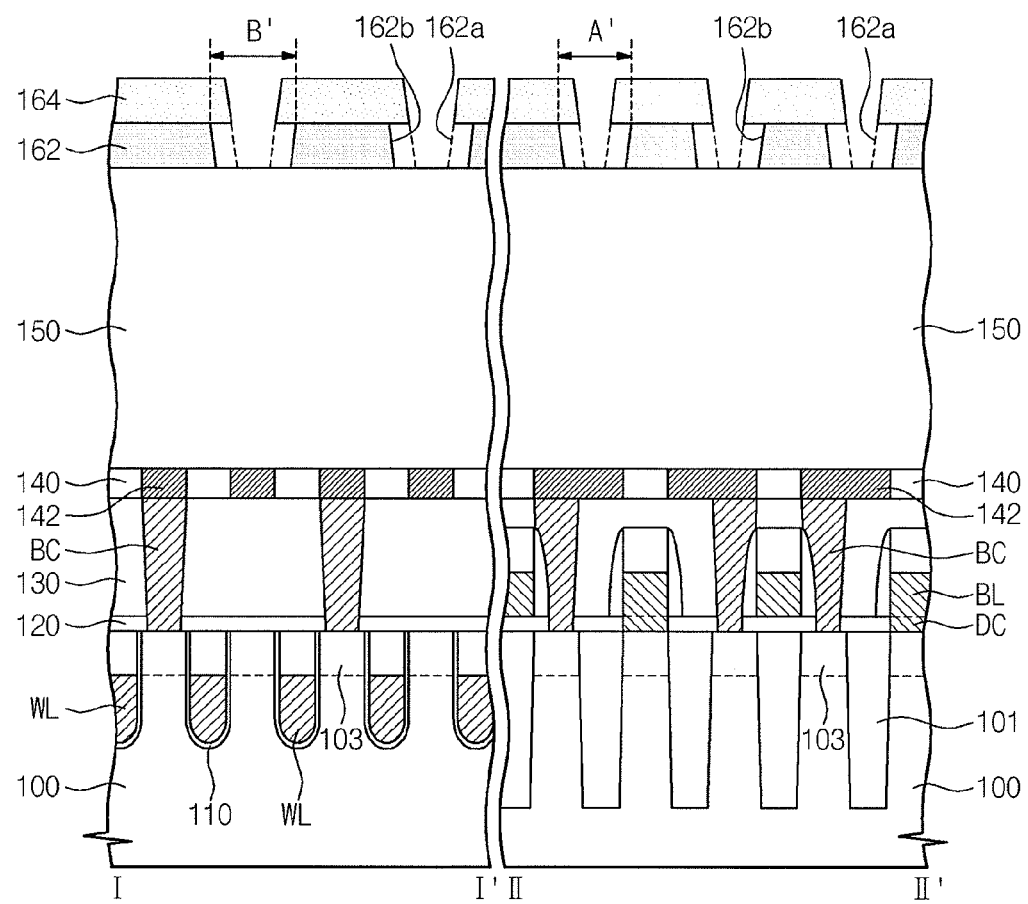

Referring to FIG. 18, an anisotropic etching process and an isotropic etching process may be sequentially performed to the third mask layer 161 to form a third mask pattern 162 with enlarged third openings 162b. The enlarged third openings 162b may be formed to expose a top surface of the mold layer 150.

Due to the use of the isotropic etching process, the enlarged third openings 162b may have an ellipticity smaller than the enlarged second openings 164b, and a difference between minor and major axis lengths of the enlarged third opening 162b may be smaller than that of the first opening 166a. The enlarged third opening 162b may have a reduced ellipticity. In example embodiments, the enlarged third opening 162b may be formed in such a way that its major axis length B' is substantially equivalent to its minor axis length A'.

Figure 19:
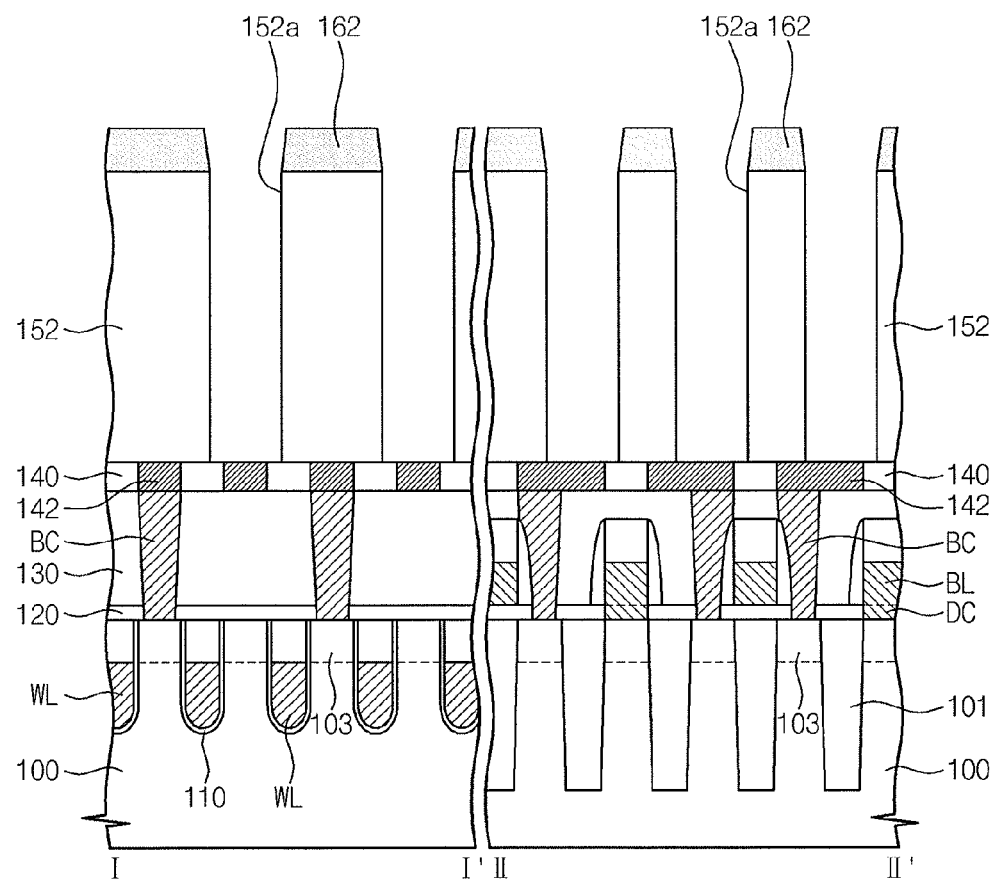

Referring to FIG. 19, the mold layer 150 may be anisotropically etched using the third mask pattern 162 as an etch mask. Accordingly, a mold pattern 152 may be formed to include lower holes 152a exposing the contact pads 142. The lower holes 152a may be formed to have the zigzag arrangement. In example embodiments, the minor and major axis lengths of the lower hole 152a may be substantially equivalent to each other.

Figure 20:
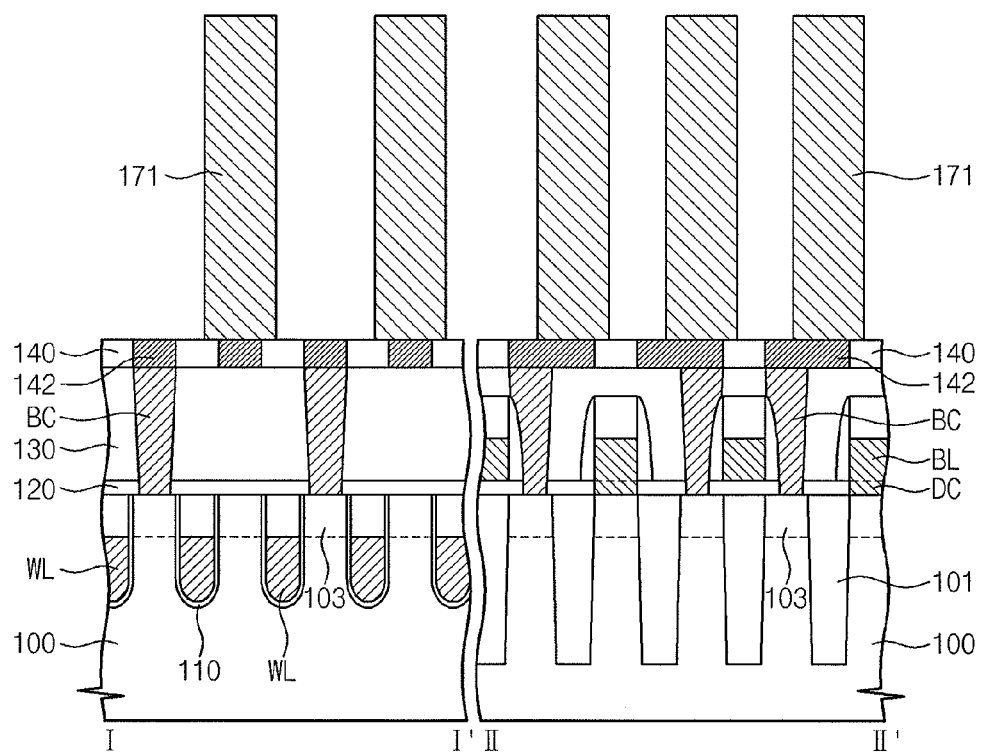

Referring to FIGS. 15 and 20, lower electrodes 171 may be formed in the lower holes 152a, respectively. The formation of the lower electrodes 171 may include depositing a conductive layer to cover conformally inner surfaces of the lower holes 152a, and then, removing the conductive layer from a top surface of the mold pattern 152. Accordingly, the lower electrode 171 may be formed to have a cylindrical shape in the lower hole 152a. The lower electrodes 171 may be electrically connected to the contact pads 142, respectively. The lower electrodes 171 may be arranged in a zigzag manner, and minor and major axis lengths thereof may be substantially equivalent to each other. After the formation of the lower electrodes 171, the mold pattern 152 may be selectively removed to expose sidewalls of the lower electrodes 171.

Figure 21:
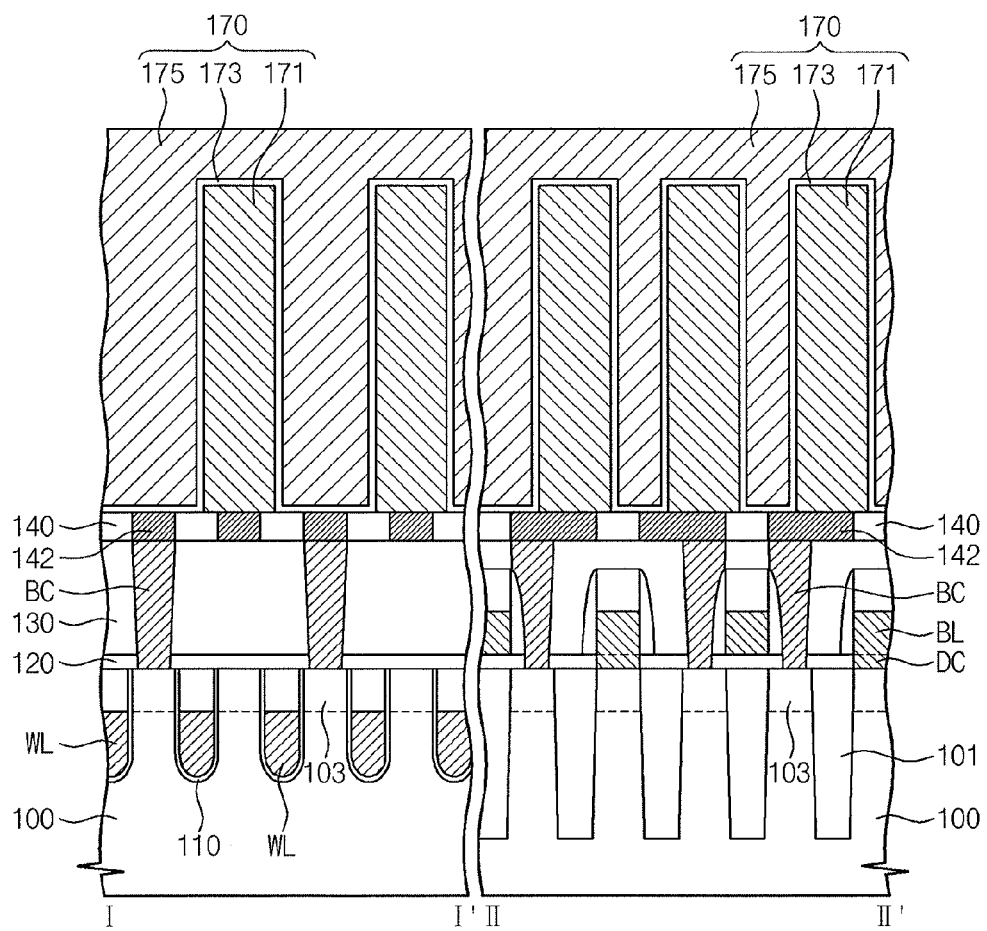

Referring to FIGS. 15 and 21, a dielectric layer 173 may be formed to cover conformally surfaces of the lower electrodes 171, and an upper electrode 175 may be formed on the dielectric layer 173. Accordingly, the lower electrode 171, the upper electrode 175, and the dielectric layer 173 interposed therebetween may constitute a capacitor 170, which may be used for a memory element of the semiconductor device.

Figure 22:
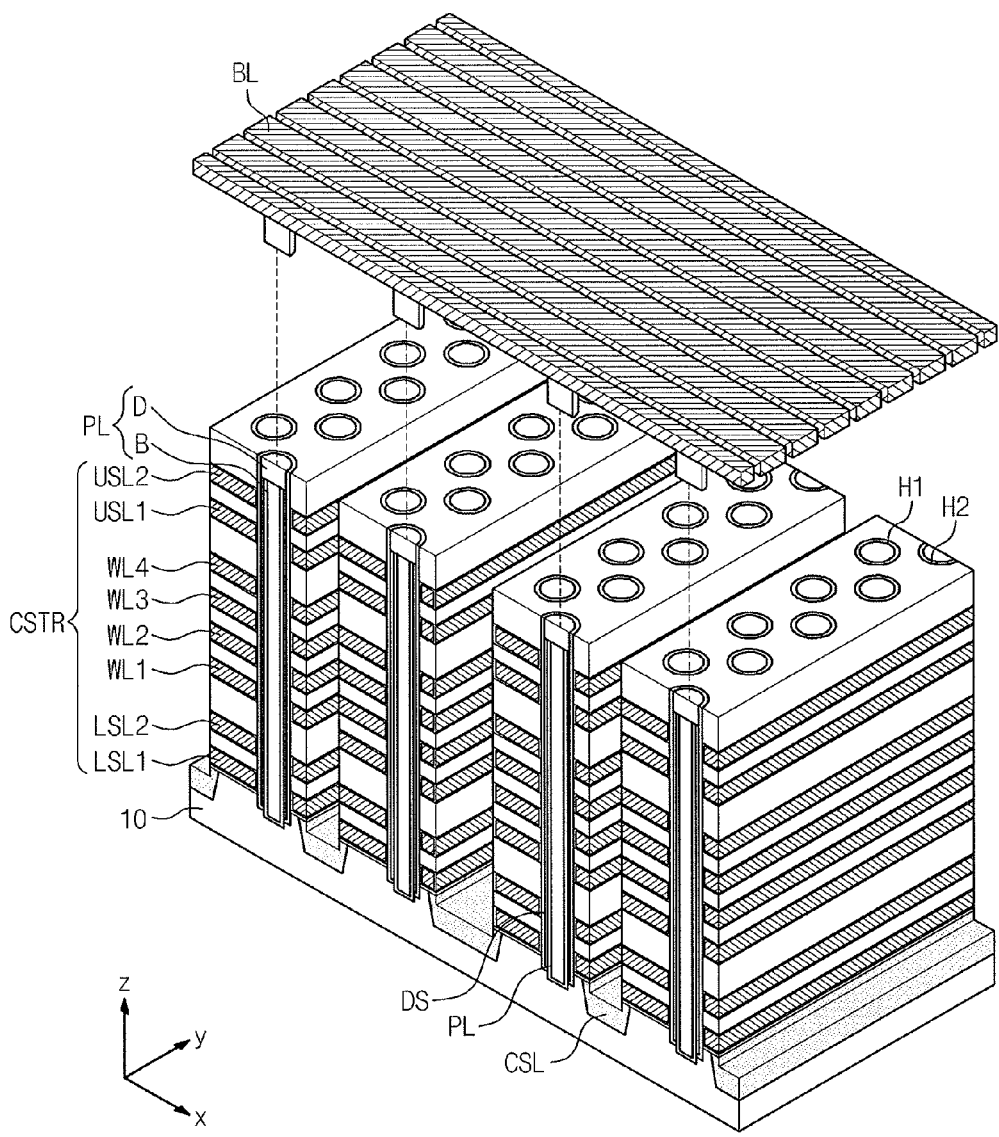
FIG. 22 illustrates a perspective view depicting a three-dimensional semiconductor memory device, which may be fabricated by the forming method of the fine pattern, according to example embodiments.

FIG. 22 illustrates a perspective view illustrating a three-dimensional semiconductor memory device that may be fabricated by the forming method of a fine pattern according to an example embodiment.

Referring to FIG. 22, the three-dimensional semiconductor memory device may include a common source line CSL, a plurality of bit lines BL, and a plurality of cell strings CSTR disposed between the common source line CSL and the bit lines BL.

The common source line CSL may be a conductive pattern provided on the substrate 10 or a doped region provided in the substrate 10. The bit lines BL may be conductive patterns (for example, metal lines) that are provided spaced apart from the substrate 10. The bit lines BL may be two-dimensionally arranged, and a plurality of the cell strings CSTR may be connected in parallel to each of the bit lines BL. The cell strings CSTR may be two-dimensionally arranged on the common source line CSL or the substrate 10.

Each of the cell strings CSTR may include a plurality of lower selection lines LSL1 and LSL2, a plurality of word lines WL1-WL4, and a plurality of upper selection lines USL1 and USL2 that are disposed between the common source line CSL and the bit lines BL. The lower selection lines LSL1 and LSL2, the word lines WL1-WL4, and the upper selection lines USL1 and USL2 may be conductive patterns that are sequentially stacked on the substrate 10.

Further, each of the cell strings CSTR may include a semiconductor pillar PL vertically extending from the substrate 10 to be connected to the bit line BL. The semiconductor pillars PL may be formed to penetrate the lower selection lines LSL1 and LSL2, the word lines WL1-WL4, and the upper selection lines USL1 and USL2. The semiconductor pillars PL may penetrate the plurality of the conductive patterns stacked on the substrate 10. Furthermore, the semiconductor pillar PL may include a body portion B and doped region(s) formed in at least one of both end portions of the body portion B. For example, a drain region D may be formed in an uppermost portion of the semiconductor pillar PL (or between the body portion B and the bit line BL).

A data storing layer DS may be disposed between the word lines WL1-WL4 and the semiconductor pillars PL. In example embodiments, the data storing layer DS may be a charge storing layer. For example, the data storing layer DS may be one of an insulating charge-trap layer, a floating gate electrode, or an insulating layer with conductive nano dots.

A dielectric layer, which serves as a gate insulating layer of a transistor, may be provided between the lower selection line LSL1 and LSL2 and the semiconductor pillars PL or between the upper selection lines USL1 and USL2 and the semiconductor pillar PL. In certain embodiments, the dielectric layer may be formed of the same material as the data storing layer DS. For example, the dielectric layer may be a material (e.g., a silicon oxide layer) used for a gate insulating layer of conventional MOSFET.

In this structure, the semiconductor pillars PL may constitute metal-oxide-semiconductor field effect transistors (MOSFETs), along with the lower selection lines LSL1 and LSL2, the word lines WL1-WL4, and the upper selection lines USL1 and USL2. Here, the semiconductor pillars PL may serve as channel or active regions for the MOSFETs. In other implementations, the semiconductor pillars PL may constitute MOS capacitors, along with the lower selection lines LSL1 and LSL2, the word lines WL1-WL4, and the upper selection lines USL1 and USL2. In example embodiments, the cell string CSTR may be configured in such a way that lower and upper selection transistors controlled by the lower and upper selection lines LSL1, LSL2, USL1, and USL2 are connected in series to cell transistors controlled by the word lines WL1-WL4.

In the three-dimensional semiconductor memory device with the semiconductor pillars PL, the semiconductor pillars PL may be formed using the method of forming the fine pattern, according to example embodiments.

In more detail, the lower selection lines LSL1 and LSL2, the word lines WL1 -WL4, and the upper selection lines USL1 and USL2 may constitute a stack with insulating and conductive layers alternatingly stacked on the substrate 10. The stack may correspond to the underlying layer described with reference to FIGS. 1B through 6B. Further, as described with reference to FIGS. 1A through 6A, an isotropic etching process, in which a mask pattern with enlarged openings is used, may be performed to form holes H1 and H2 in the stack. The first and second holes H1 and H2 may be formed to have a zigzag arrangement. In example embodiments, in plan view, the first and second holes H1 and H2 may be shaped as circles with substantially uniform diameters. Thereafter, the data storing layer DS and the semiconductor pillars PL may be formed in the first and second holes H1 and H2 of FIG. 19.

Figure 23:
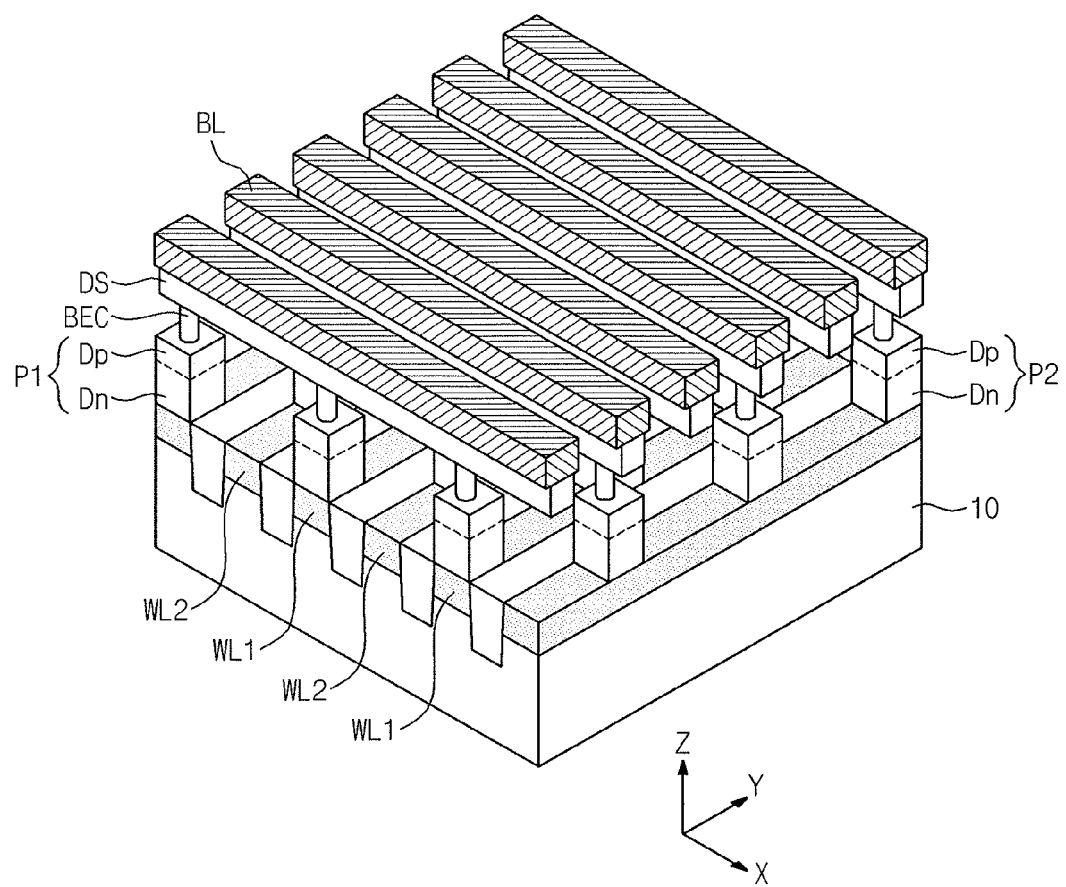
FIG. 23 illustrates a perspective view depicting a variable resistance memory device, which may be fabricated by the forming method of the fine pattern, according to example embodiments.

FIG. 23 illustrates a perspective view illustrating a variable resistance memory device that may be fabricated by the forming method of a fine pattern, according to example embodiments.

Referring to FIG. 23, the variable resistance memory device may include a semiconductor substrate 10, lower interconnection lines WL1 and WL2 on the semiconductor substrate 10, upper interconnection lines BL crossing the lower interconnection lines WL1 and WL2, selection devices provided at intersections between the lower interconnection lines WL1 and WL2 and the upper interconnection lines BL, and memory elements DS provided between the selection devices and the upper interconnection lines BL. The selection devices may be two-dimensionally arranged on the semiconductor substrate 10 to control a flow of an electric current passing through the memory element DS.

Each of the lower interconnection lines WL1 and WL2 may be shaped like a line extending along a y-axis on the semiconductor substrate 10. In some embodiments, the lower interconnection lines WL1 and WL2 may be impurity regions that are formed by highly doping the semiconductor substrate 10 with impurities. The lower interconnection lines WL1 and WL2 may be doped to have a different conductivity type from the semiconductor substrate 10.

In the present embodiment, the selection devices may include semiconductor patterns P1 and P2, which may be formed by the afore-described method of forming a fine pattern. The semiconductor patterns P1 and P2 may be formed by an isotropic etching process as described above, in which a mask pattern with enlarged openings is used. Accordingly, the semiconductor patterns P1 and P2 may be arranged on the semiconductor substrate 10 to form a zigzag arrangement. In plan view, the semiconductor patterns P1 and P may be shaped as circles with substantially uniform diameters.

The selection devices may include first semiconductor patterns P1 provided on odd-numbered ones of the lower interconnection lines WL1 and WL2 and second semiconductor patterns P2 provided on even-numbered ones of the lower interconnection lines WL1 and WL2. When measured along the first direction or the x-axis direction, the first and second semiconductor patterns P1 and P2 may have a pitch that is greater than twice a pitch of the lower interconnection lines WL1 and WL2. Further, the second semiconductor patterns P2 may be offset from the first semiconductor patterns P1 in the y-axis direction.

Each of the first and second semiconductor patterns P1 and P2 may include an upper doped region Dp and a lower doped region Dn that have different conductivity types from each other. For example, the lower doped region Dn may have the same conductivity type as that of the lower interconnection lines WL1 and WL2, while the upper doped region Dp may have a different conductivity type from that of the lower doped region Dn. Accordingly, a PN junction may be formed in each of the first and second semiconductor patterns P1 and P2. In other embodiments, an intrinsic region may be provided between the upper doped region Dp and the lower doped region Dn, and thus, a PiN junction may be formed in each of the first and second semiconductor patterns P1 and P2. In certain embodiments, the semiconductor substrate 10, the lower interconnection line WL, and the first and second semiconductor patterns P1 and P2 may be configured to form a PNP or NPN bipolar transistor.

Lower electrodes BEC, memory elements DS, and upper interconnection lines BL may be provided on the first and second semiconductor patterns P1 and P2. The upper interconnection lines BL may be provided to cross the lower interconnection lines WL1 and WL2 on the memory elements DS and connect the memory elements DS electrically to each other.

In example embodiments, each of the memory elements DS may be formed to be substantially parallel to the upper interconnection lines BL and to be connected to a plurality of the lower electrodes BEC. In other implementations, the memory elements DS may be provided to have a two-dimensional arrangement. For example, each of the memory elements DS may be provided on the corresponding one of the first and second semiconductor patterns P1 and P2. The memory elements DS may be a variable resistance pattern, the resistance of which can be reversibly changed using an electric pulse applied thereto. In example embodiments, the memory element DS may include a phase-change material, the crystalline state of which can be changed by an amount of electric current passing through the memory element DS. In other embodiments, the memory element DS may include at least one of perovskite compounds, transition metal oxides, magnetic materials, ferromagnetic materials, or antiferromagnetic materials.

Each of the lower electrodes BEC may be provided between the corresponding one of the first and second semiconductor patterns P1 and P2 and the corresponding one of the memory elements DS. In plan view, the lower electrode BEC may have an area that is smaller than that of each of the first and second semiconductor patterns P1 and P2 or that of each memory element DS.

In some embodiments, the lower electrodes BEC may be formed to have a pillar-shaped structure. In other embodiments, a structure of the lower electrode BEC may be variously modified to have a reduced sectional area. For example, the lower electrode BEC may be shaped like the letter 'U', the letter the hollow circular pillar, a ring, or a cup.

Further, an ohmic layer may be provided between the lower electrodes BEC and the first and second semiconductor patterns P1 and P2 to decrease a contact resistance therebetween. For example, the ohmic layer may include metal silicides, such as titanium silicide, cobalt silicide, tantalum silicide, and tungsten silicide.

Figure 24:
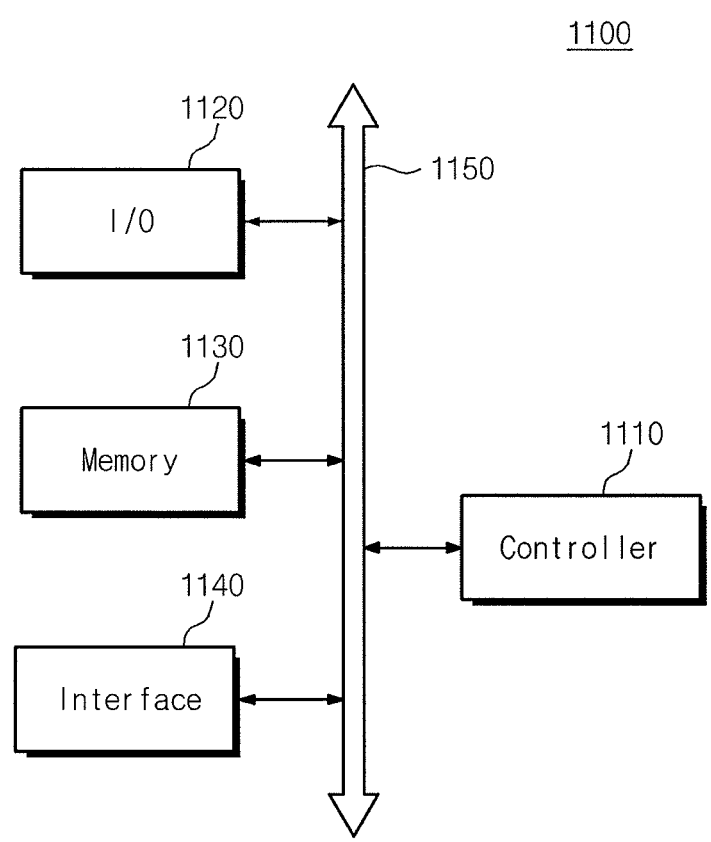
FIG. 24 illustrates a schematic block diagram depicting an example of an electronic system with a semiconductor device according to example embodiments.

FIG. 24 illustrates a schematic block diagram depicting an example of an electronic system including a semiconductor device formed according to example embodiments.

Referring to FIG. 24, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to example embodiments.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless. One or more components of the electronic system 1100 may include a semiconductor device including a fine pattern formed according to example embodiments FIG. 25 illustrates a schematic block diagram illustrating another example of an electronic system with a semiconductor memory device formed according to example embodiments.

Figure 25:
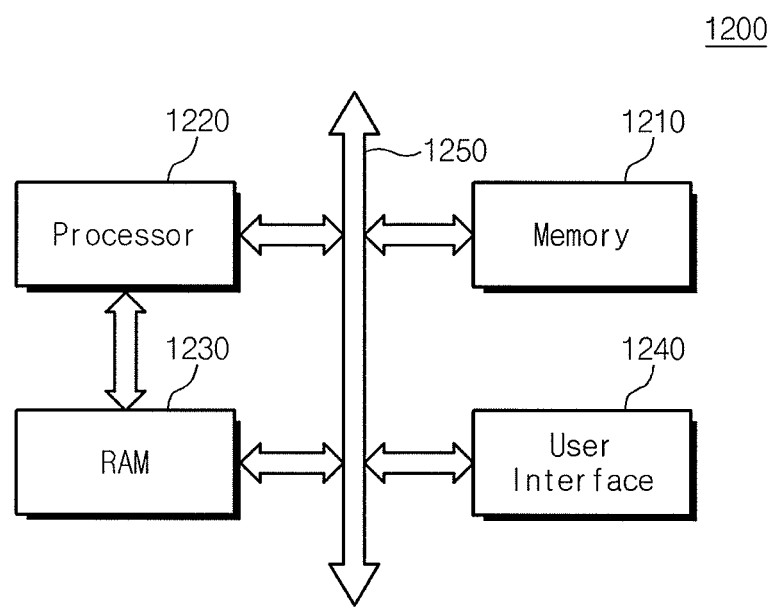
FIG. 25 illustrates a schematic block diagram depicting another example of an electronic system with a semiconductor memory device according to example embodiments.

Referring to FIG. 25, an electronic system 1200 may include at least one semiconductor memory device formed according to the embodiments described above. The electronic system 1200 may include a mobile device or a computer. As an illustration, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, all or each of the processor 1220 and the RAM 1230 may include a semiconductor device including a fine pattern formed according to example embodiments. In other implementations, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220 or data inputted from the outside. The memory system 1210 may include a controller and a memory device.

The electronic system 1200 may be a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1200 performs wireless communication, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

By way of summation and review, as semiconductor devices are scaled down, it may become more difficult to form fine patterns, for example, due to a technical limitation in resolution of a photolithography process. For example, in the case where the fine patterns are provided to have a square-shaped arrangement, there may be a difficulty in increasing a width or diameter of the fine patterns in a given area.

When the fine patterns are provided to have a zigzag- or honeycomb-shaped arrangement, a space between the fine patterns may be increased, compared with the case of the square-shaped arrangement. This means that the fine patterns provided in the honeycomb-shaped arrangement may have an increased diameter than in the square-shaped arrangement.

Line-and-space patterns crossing each other in a diagonal direction may be used as a mask pattern for forming the fine patterns arranged to have a honeycomb-shaped arrangement. However, in the case where the line-and-space patterns cross each other in the diagonal direction, a region to be etched may be shaped like a diamond or an ellipse, which may lead to a reduction in a short margin between two patterns and deteriorated contact property.

According to example embodiments, a wet etching process may be performed to enlarge the diamond-shaped or elliptical openings. For example, as the result of the wet etching process, the enlarged openings may have an ellipticity close to zero. In addition, the ellipticity may be controlled by adjusting process parameters of the enlarging process. The elliptical openings may be enlarged to reduce a ratio between their major and minor axis lengths, and thus, circular openings with a uniform diameter may be formed in the zigzag arrangement. Further, the forming method of the fine patterns may be used to fabricate high-density semiconductor devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a fine pattern, the method comprising:
   forming first line mask patterns on a mask layer to extend along a direction;
   forming second line mask patterns to extend along a diagonal direction with respect to the first line mask patterns;
   anisotropically etching the mask layer exposed by the first and second line mask patterns to form elliptical openings; and
   isotropically etching the mask layer provided with the openings to form a mask pattern with enlarged openings,
   wherein each of forming the first line mask patterns and forming the second line mask patterns includes:
      forming photoresist patterns on the mask layer that are repeatedly arranged with a first pitch;
      depositing a spacer layer on the mask layer to cover the photoresist patterns conformally; and
      anisotropically etching the spacer layer.

2. The method as claimed in claim 1, wherein forming the mask pattern with the enlarged openings reduces an ellipticity of the openings.

3. The method as claimed in claim 1, wherein the ellipticity of the openings is dependent on an etch amount of the mask layer in the isotropic etching.

4. The method as claimed in claim 1, wherein the enlarged openings have an ellipticity ranging from 0.0 to 0.2.

5. The method as claimed in claim 1, wherein the mask layer includes first, second, and third mask layers that are sequentially stacked and that have an etch selectivity with respect to each other.

6. The method as claimed in claim 5, wherein forming the elliptical openings includes anisotropically etching the third mask layer to form first openings exposing a top surface of the second mask layer.

7. The method as claimed in claim 6, wherein forming the enlarged openings includes:
   sequentially performing an anisotropic etching process and an isotropic etching process to the second mask layer exposed by the first openings to form second openings; and
   sequentially performing an anisotropic etching process and an isotropic etching process to the first mask layer exposed by the second openings to form third openings exposing an underlying layer.

8. The method as claimed in claim 7, wherein:
   the second openings have an ellipticity that is less than that of the first openings, and
   the third openings have an ellipticity that is less than that of the second openings.

9. The method as claimed in claim 1, wherein the second line mask patterns are formed at an angle of about 15-75 degrees or at an angle of about 115-165 degrees relative to the first line mask patterns.

10. The method as claimed in claim 1, wherein the first and second line mask patterns are formed to have mirror symmetry with respect to each other.

11. A method of forming a fine pattern, the method comprising:
   forming a mask layer on an underlying layer to include a plurality of stacked layers;
   forming first line mask patterns extending along a direction on the mask layer;
   forming second line mask patterns extending along a diagonal direction with respect to the first line mask patterns to define diamond-shaped etching regions on the mask layer; and
   alternatingly performing an anisotropic etching process and an isotropic etching process to each of the stacked layers successively through the diamond-shaped etching regions to form a mask pattern with enlarged openings that expose the underlying layer.

12. The method as claimed in claim 11, wherein the anisotropic and isotropic etching processes reduce an ellipticity of the etching region.

13. The method as claimed in claim 11, wherein forming the enlarged openings includes changing a shape of the openings from an ellipse to a circle.

14. The method as claimed in claim 11, further comprising anisotropically etching the underlying layer using the mask pattern as an etch mask to form lower holes that are arranged in a zigzag manner and have a substantially uniform diameter.

15. A method of forming a semiconductor device having a fine pattern, the method comprising:
- providing a mask layer on an underlying layer;
- forming first line mask patterns on the mask layer, the first line mask patterns being spaced apart from each other and the first line mask patterns extending along a first direction;
- forming second line mask patterns, the second line mask patterns being spaced apart from each other and the second line mask patterns extending along a second direction with respect to the first line mask patterns, the second direction being at an angle of about 15-75 degrees to the first direction, such that diamond-shaped etching regions are defined on the mask layer by adjacent ones of the first line mask patterns and adjacent ones of the second line mask patterns;
- anisotropically etching the mask layer at the diamond-shaped etching regions to form elliptical openings;
- isotropically etching the mask layer provided with the openings to form a mask pattern with enlarged openings to expose the underlying layer, the enlarged openings being arranged in a zigzag manner and having a substantially uniform diameter; and
- anisotropically etching the underlying layer using the mask pattern as an etch mask to form lower holes.

16. The method as claimed in claim 15, wherein the underlying layer is a mold layer, and the method further includes forming capacitors in the lower holes.

17. The method as claimed in claim 15, wherein the underlying layer is a stacked structure of cell strings, and the method further includes forming semiconductor pillars in the lower holes.

18. The method as claimed in claim 15, further including forming semiconductor patterns of a variable resistance memory device in the lower holes.

* * * * *